(12) United States Patent
Sakamoto et al.

(10) Patent No.: US 8,865,568 B2
(45) Date of Patent: *Oct. 21, 2014

(54) WORKPIECE CUTTING METHOD

(71) Applicant: Hamamatsu Photonics K.K., Hamamatsu (JP)

(72) Inventors: Takeshi Sakamoto, Hamamatsu (JP); Aiko Nakagawa, Hamamatsu (JP)

(73) Assignee: Hamamatsu Photonics K.K, Hamamatsu-shi, Shizuoka (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/256,370

(22) Filed: Apr. 18, 2014

(65) Prior Publication Data

US 2014/0227860 A1    Aug. 14, 2014

Related U.S. Application Data

(63) Continuation of application No. 13/148,097, filed as application No. PCT/JP2010/051047 on Jan. 27, 2010, now Pat. No. 8,728,914.

(30) Foreign Application Priority Data

Feb. 9, 2009   (JP) ................. 2009-027263

(51) Int. Cl.
| | | |
|---|---|---|
| *H01L 21/00* | (2006.01) | |
| *H01L 21/20* | (2006.01) | |
| *H01L 21/36* | (2006.01) | |
| *H01L 21/44* | (2006.01) | |
| *H01L 21/78* | (2006.01) | |

(52) U.S. Cl.
CPC ...................................... *H01L 21/78* (2013.01)
USPC ........... 438/462; 438/113; 438/460; 438/463; 438/467; 438/662; 257/E21.238; 257/E21.347; 257/E21.599

(58) Field of Classification Search
None
See application file for complete search history.

(56) References Cited

U.S. PATENT DOCUMENTS

| 4,546,231 A | 10/1985 | Gresser et al. |
|---|---|---|
| 6,992,026 B2 | 1/2006 | Fukuyo et al. |

(Continued)

FOREIGN PATENT DOCUMENTS

| CN | 1160228 A | 9/1997 |
|---|---|---|
| CN | 1779914 | 5/2006 |

(Continued)

OTHER PUBLICATIONS

U.S. Appl. No. 13/206,181, filed Aug. 9, 2011.

(Continued)

*Primary Examiner* — Mohsen Ahmadi
(74) *Attorney, Agent, or Firm* — Drinker Biddle & Reath LLP

(57) ABSTRACT

Fractures (17a, 17b) are generated from modified regions (7a, 7b) to front and rear faces (12a, 12b) of a object to be processed (1), respectively, while an unmodified region (2) is interposed between the modified regions (7a, 7b). This can prevent fractures from continuously advancing in the thickness direction of a silicon substrate (12) when forming a plurality of rows of modified regions (7). By generating a stress in the object (1), the fractures (17a, 17b) are connected to each other in the unmodified region (2), so as to cut the object (1). This can prevent fractures from meandering in the rear face (12b) of the object (1) and so forth, whereby the object (1) can be cut accurately along a line to cut the object (5).

10 Claims, 29 Drawing Sheets

(56) References Cited

U.S. PATENT DOCUMENTS

| | | |
|---|---|---|
| 7,396,742 B2 | 7/2008 | Fukuyo et al. |
| 7,489,454 B2 | 2/2009 | Fukuyo et al. |
| 7,547,613 B2 | 6/2009 | Fukuyo et al. |
| 7,566,635 B2 | 7/2009 | Fujii et al. |
| 7,592,237 B2 | 9/2009 | Sakamoto et al. |
| 7,592,238 B2 | 9/2009 | Fukuyo et al. |
| 7,605,344 B2 | 10/2009 | Fukumitsu |
| 7,608,214 B2 | 10/2009 | Kuno et al. |
| 7,615,721 B2 | 11/2009 | Fukuyo et al. |
| 7,626,137 B2 | 12/2009 | Fukuyo et al. |
| 7,709,767 B2 | 5/2010 | Sakamoto |
| 7,718,510 B2 | 5/2010 | Sakamoto et al. |
| 7,719,017 B2 | 5/2010 | Tanaka |
| 7,732,730 B2 | 6/2010 | Fukuyo et al. |
| 7,749,867 B2 | 7/2010 | Fukuyo et al. |
| 7,754,583 B2 | 7/2010 | Sakamoto |
| 7,825,350 B2 | 11/2010 | Fukuyo et al. |
| 7,897,487 B2 | 3/2011 | Sugiura et al. |
| 7,902,636 B2 | 3/2011 | Sugiura et al. |
| 7,939,430 B2 | 5/2011 | Sakamoto et al. |
| 7,947,574 B2 | 5/2011 | Sakamoto et al. |
| 2004/0002199 A1 | 1/2004 | Fukuyo et al. |
| 2005/0202596 A1 | 9/2005 | Fukuyo et al. |
| 2005/0272223 A1 | 12/2005 | Fujii et al. |
| 2006/0011593 A1 | 1/2006 | Fukuyo et al. |
| 2006/0144828 A1 | 7/2006 | Fukumitsu et al. |
| 2006/0148212 A1 | 7/2006 | Fukuyo et al. |
| 2006/0255024 A1 | 11/2006 | Fukuyo et al. |
| 2007/0085099 A1 | 4/2007 | Fukumitsu et al. |
| 2007/0125757 A1 | 6/2007 | Fukuyo et al. |
| 2007/0158314 A1 | 7/2007 | Fukumitsu et al. |
| 2007/0252154 A1 | 11/2007 | Uchiyama et al. |
| 2008/0035611 A1 | 2/2008 | Kuno et al. |
| 2008/0037003 A1 | 2/2008 | Atsumi et al. |
| 2008/0090382 A1 | 4/2008 | Fujii et al. |
| 2008/0218735 A1 | 9/2008 | Atsumi et al. |
| 2008/0251506 A1 | 10/2008 | Atsumi et al. |
| 2009/0008373 A1 | 1/2009 | Muramatsu et al. |
| 2009/0032509 A1 | 2/2009 | Kuno et al. |
| 2009/0098713 A1 | 4/2009 | Sakamoto |
| 2009/0107967 A1 | 4/2009 | Sakamoto et al. |
| 2009/0117712 A1 | 5/2009 | Sakamoto et al. |
| 2009/0166342 A1 | 7/2009 | Kuno et al. |
| 2009/0166808 A1 | 7/2009 | Sakamoto et al. |
| 2009/0212396 A1* | 8/2009 | Sugiura et al. ............ 257/618 |
| 2009/0250446 A1 | 10/2009 | Sakamoto |
| 2009/0261083 A1 | 10/2009 | Osajima et al. |
| 2009/0302428 A1 | 12/2009 | Sakamoto et al. |
| 2010/0006548 A1 | 1/2010 | Atsumi et al. |
| 2010/0009547 A1 | 1/2010 | Sakamoto |
| 2010/0012632 A1 | 1/2010 | Sakamoto |
| 2010/0012633 A1 | 1/2010 | Atsumi et al. |
| 2010/0015783 A1 | 1/2010 | Fukuyo et al. |
| 2010/0025386 A1 | 2/2010 | Kuno et al. |
| 2010/0032418 A1 | 2/2010 | Kuno et al. |
| 2010/0055876 A1 | 3/2010 | Fukuyo et al. |
| 2010/0151202 A1 | 6/2010 | Fukumitsu |
| 2010/0176100 A1 | 7/2010 | Fukuyo et al. |
| 2010/0184271 A1 | 7/2010 | Sugiura et al. |
| 2010/0197116 A1 | 8/2010 | Shah et al. |
| 2010/0200550 A1 | 8/2010 | Kumagai |
| 2010/0203678 A1 | 8/2010 | Fukumitsu et al. |
| 2010/0203707 A1 | 8/2010 | Fujii et al. |
| 2010/0227453 A1 | 9/2010 | Sakamoto |
| 2010/0240159 A1 | 9/2010 | Kumagai et al. |
| 2010/0258539 A1 | 10/2010 | Sakamoto |
| 2010/0301521 A1 | 12/2010 | Uchiyama |
| 2010/0311313 A1 | 12/2010 | Uchiyama |
| 2010/0327416 A1 | 12/2010 | Fukumitsu |
| 2011/0000897 A1 | 1/2011 | Nakano et al. |
| 2011/0001220 A1 | 1/2011 | Sugiura et al. |
| 2011/0021004 A1 | 1/2011 | Fukuyo et al. |
| 2011/0027971 A1 | 2/2011 | Fukuyo et al. |
| 2011/0027972 A1 | 2/2011 | Fukuyo et al. |
| 2011/0037149 A1 | 2/2011 | Fukuyo et al. |
| 2011/0274128 A1 | 11/2011 | Fukumitsu et al. |

FOREIGN PATENT DOCUMENTS

| | | |
|---|---|---|
| CN | 1853840 | 11/2006 |
| CN | 1938828 | 3/2007 |
| JP | 2006-135355 | 5/2005 |
| JP | 2006-108459 | 4/2006 |
| JP | 2006-167804 | 6/2006 |
| JP | 2007-245173 | 9/2007 |
| JP | 2009-10105 | 1/2009 |

OTHER PUBLICATIONS

U.S. Appl. No. 13/269,274, filed Oct. 7, 2011.
U.S. Appl. No. 13/235,936, filed Sep. 19, 2011.
U.S. Appl. No. 13/213,175, filed Aug. 19, 2011.
U.S. Appl. No. 13/233,662, filed Sep. 15, 2011.
U.S. Appl. No. 13/061,438, filed Apr. 26, 2011.
U.S. Appl. No. 13/107,056, filed May 13, 2011.
U.S. Appl. No. 13/151,877, filed Jun. 2, 2011.
U.S. Appl. No. 13/131,429, filed Jun. 28, 2011.
U.S. Appl. No. 13/143,636, filed Sep. 21, 2011.
U.S. Appl. No. 13/262,995, filed Oct. 5, 2011.
U.S. Appl. No. 13/265,027, filed Oct. 18, 2011.
X. Liu, et al., "Laser Ablation and Micromachining with Ultrashort Laser Pulses," IEEE Journal of Quantum Electronics, vol. 33, No. 10, Oct. 1997, pp. 1706-1716.

* cited by examiner

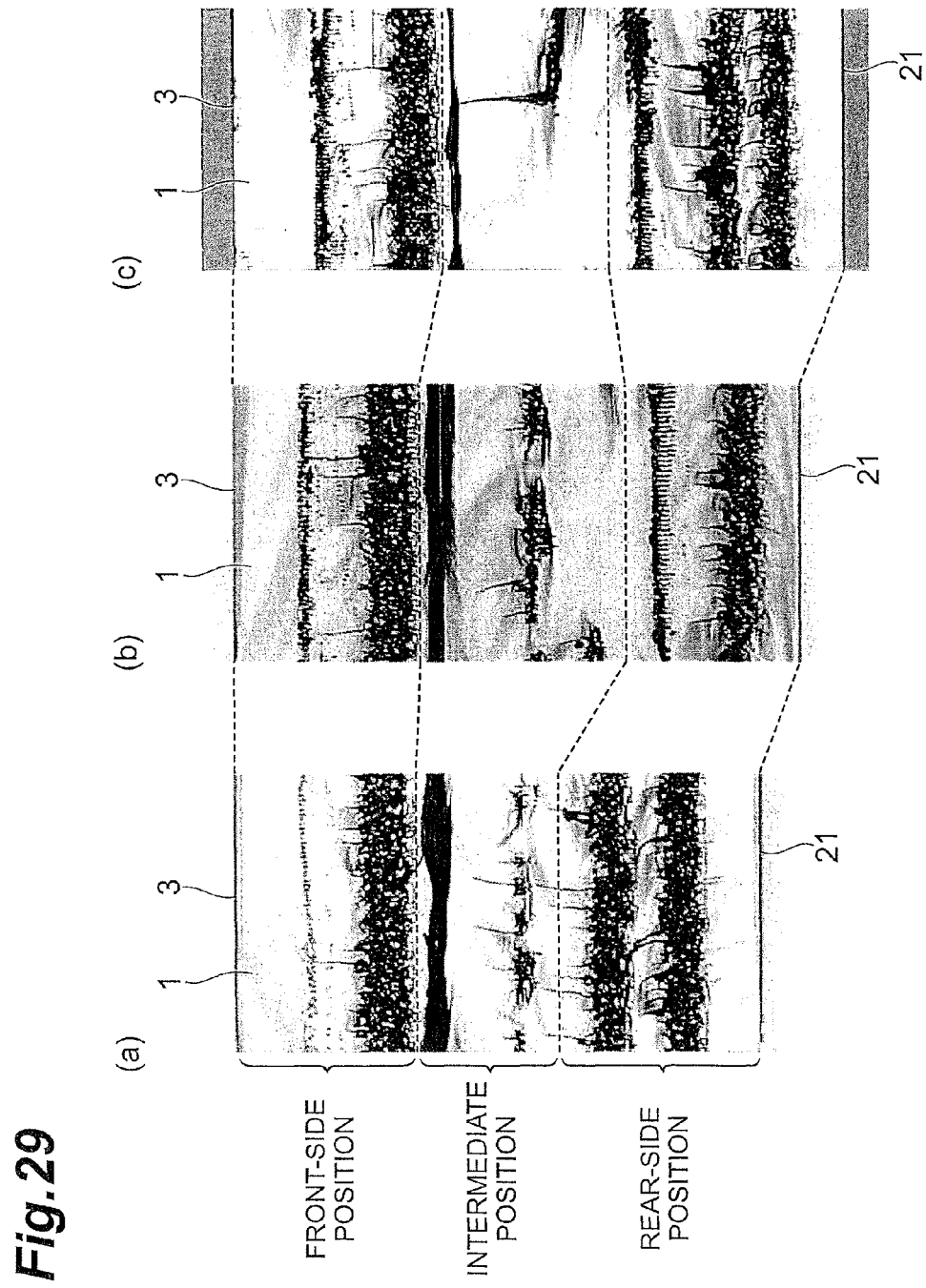

WORKPIECE CUTTING METHOD

This is a continuation application of copending application Ser. No. 13/148,097, having a §371 date of Aug. 26, 2011, which is a national stage filing based on PCT International Application No. PCT/JP2010/051047, filed on Jan. 27, 2010. The copending application Ser. No. 13/148,097 is incorporated by reference herein in its entirety.

1. Technical Field

The present invention relates to a method of cutting an object to be processed for cutting a sheet-like object to be processed equipped with a silicon substrate along a line to cut the object.

2. Background Art

Known as a conventional method of cutting an object to be processed in the above-mentioned technical field is one irradiating a sheet-like object to be processed equipped with a silicon substrate with a laser light having a wavelength of 1300 nm, for example, so as to form a modified region to become a cutting start point along a line to cut the object (see, for example, Patent Literature 1).

CITATION LIST

Patent Literature

Patent Literature 1: Japanese Patent Application Laid-Open No. 2006-108459

SUMMARY OF INVENTION

Technical Problem

The silicon substrate exhibits a higher transmittance for the laser light having a wavelength of 1300 nm than the laser light having a wavelength of 1064 nm, for example, whereby a greater modified region can be formed by the laser light having a wavelength of 1300 nm even at a position deep from the laser light entrance surface of the silicon substrate. Therefore, when cutting an object to be processed by forming a plurality of rows of modified regions in the thickness direction of the silicon substrate along a line to cut the object, for example, the number of rows of the modified regions can be reduced, so as to shorten the takt time.

The use of the laser light having a wavelength of 1300 nm can form a greater modified region but may cause fractures to advance continuously in the thickness direction of the silicon substrate when forming a plurality of rows of modified regions in the thickness direction of the silicon substrate, so as to let the fractures meander in a main face of the object and so forth, thereby lowering the accuracy in cutting the object.

In view of such circumstances, it is an object of the present invention to provide a method of cutting an object to be processed which can cut a sheet-like object to be processed equipped with a silicon substrate accurately along a line to cut the object, while reducing the number of rows of modified regions formed in the thickness direction of the silicon substrate along the line.

Solution to Problem

For achieving the above-mentioned object, the method of cutting an object to be processed in accordance with the present invention is a method of cutting an object to be processed, the method of irradiating a sheet-like object to be processed equipped with a silicon substrate with a laser light so as to form a modified region in the silicon substrate along a line to cut the object and cutting the object along the line from the modified region acting as a cutting start point, the method comprising the steps of forming a first modified region as the modified region so as to generate a first fracture from the first modified region to one main face of the object along the line, and a second modified region as the modified region on the other main face side of the first modified region such that an unmodified region is interposed between the first and second modified regions so as to generate a second fracture from the second modified region to the other main face along the line without connecting the second fracture to the first fracture in the unmodified region; and generating a stress in the object so as to connect the first and second fractures to each other and cut the object along the line.

While interposing an unmodified region between first and second modified regions, this method of cutting an object to be processed generates a first fracture from the first modified region to one main face of the object and a second fracture from the second modified region to the other main face of the object. This can prevent fractures from continuously advancing in the thickness direction of the silicon substrate even when a laser light having a wavelength of 1064 nm or more is used so as to reduce the number of rows of modified regions in the case where a plurality of rows of modified regions are formed in the thickness direction of the silicon substrate. By generating a stress in the object, the method of cutting the object to be processed connects the first and second fractures to each other, so as to cut the object. This can prevent fractures from meandering in the main face of the object and so forth, whereby the object can be cut accurately along the line. As in the foregoing, this method of cutting an object to be processed can accurately cut a sheet-like object to be processed equipped with a silicon substrate along the line while reducing the number of rows of modified regions formed in the thickness direction of the silicon substrate along the line.

Preferably, the first and second modified regions are formed such that, in a pair of cut surfaces of the object cut along the line, the unmodified region in one cut surface is formed with a projection extending in a direction intersecting the thickness direction of the silicon substrate, while the unmodified region in the other cut surface is formed with a depression corresponding to the projection. Thus forming the first and second modified regions can more reliably prevent fractures from continuously advancing in the thickness direction of the silicon substrate and connect the first and second fractures to each other, so as to cut the object along the line more accurately.

Preferably, in this case, the first and second modified regions are formed such that, assuming the main faces of the silicon substrate to be (100) planes, the cut surfaces are (110) planes, and the surfaces forming the projection and depression are (111) planes. Thus foaming the first and second modified regions can suppress the height of the projection and the depth of the depression at the time of cutting the object along the line, thereby yielding smoother cut surfaces.

Preferably, the first and second modified regions are formed such that the projection has a height of 2 μm to 6 μm and a width of 6 μm to 17 μm in the thickness direction of the silicon substrate. Thus forming the first and second modified regions can not only prevent fractures from meandering in the main face of the object and so forth but also avoid cut residues at the time of cutting the object along the line.

Forming a plurality of rows of first modified regions in the thickness direction of the silicon substrate along the line or forming a plurality of rows of second modified regions in the thickness direction of the silicon substrate along the line is also preferred. This can adjust the widths of the first and second fractures and unmodified region in the thickness direction of the silicon substrate according to the thickness of the silicon substrate.

The modified region may include a molten processed region which is a region having changed from a monocrystal structure to an amorphous structure, a region having changed from the monocrystal structure to a polycrystal structure, or a region having changed from the monocrystal structure to a structure including the amorphous and polycrystal structures, while the unmodified region is a region having the monocrystal structure.

Preferably, the laser light has a wavelength of 1080 nm or more. This raises the transmittance in the silicon substrate, whereby the first and second modified regions formed by irradiation with the laser light can be made greater, so as to reduce the number of rows of modified regions formed in the thickness direction of the silicon substrate more reliably.

Preferably, the first and second modified regions are formed such that the width of the unmodified region in the thickness direction of the silicon substrate is 10% to 30% of the thickness of the silicon substrate. Thus forming the first and second modified regions can prevent fractures from meandering in the main face of the object and avoid cut residues at the time of cutting the object along the line, whereby the object can be cut accurately and reliably along the line.

Preferably, when forming a third modified region as a modified region in the unmodified region interposed between the first and second modified regions after forming the first modified region before forming the second modified region, the laser light is modulated by a spatial light modulator according to a modulation pattern including a quality pattern having a first lightness region extending in a direction intersecting the line and second lightness regions neighboring the first lightness region on both sides in an extending direction of the line. Thus forming the third modified region can prevent fractures from continuously advancing in the thickness direction of the object when forming a plurality of rows of modified regions in the thickness direction of the object even by using a laser light having a wavelength longer than 1064 nm in order to reduce the number of rows of modified regions. Also, when a stress is generated in the object, fractures generated from the modified regions acting as a start point are easier to extend in the thickness direction of the object than in the case where the third modified region is not formed, whereby the object can be cut more accurately along the line.

Preferably, when forming the third modified region, the modulation pattern includes a quality pattern, an individual difference correction pattern for correcting an individual difference occurring in a laser machining device, and a spherical aberration correction pattern for correcting the spherical aberration occurring depending on a material of the object and a distance from a laser light entrance surface of the object to the converging point of the laser light, while the laser light is modulated by the spatial light modulator according to a modulation pattern including the individual difference correction pattern and the spherical aberration correction pattern when forming the first and second modified regions. This can make each of the first, second, and third modified regions easier to generate fractures, whereby the number of rows of modified regions formed in the thickness direction of the object along the line can be reduced more reliably.

Advantageous Effects of Invention

The present invention can cut a sheet-like object to be processed equipped with a silicon substrate accurately along a line to cut the object, while reducing the number of rows of modified regions formed in the thickness direction of the silicon substrate along the line.

BRIEF DESCRIPTION OF DRAWINGS

FIG. 29 is a second chart illustrating a cut surface obtained when an object to be processed is cut from modified regions acting as a start point.

DESCRIPTION OF EMBODIMENTS

Figure 1:
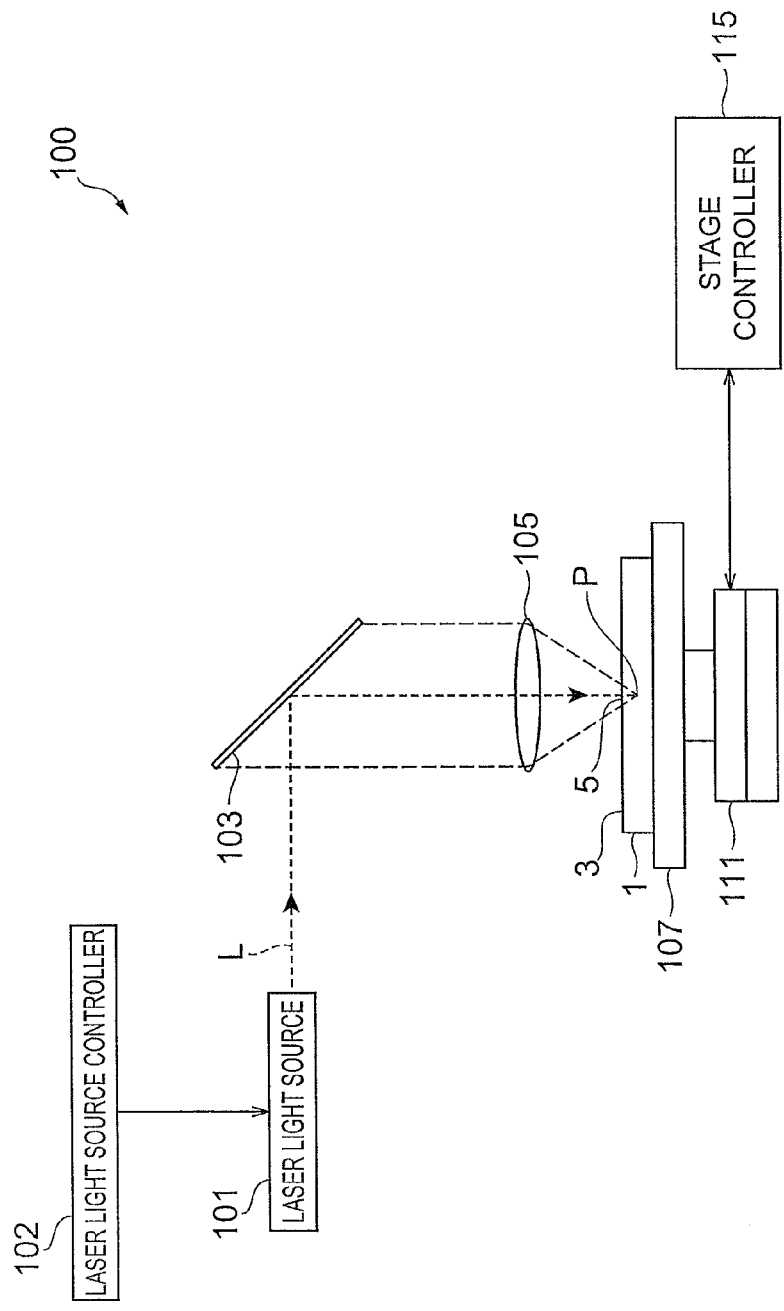
FIG. 1 is a schematic structural diagram of a laser machining device used for forming a modified region.

In the following, preferred embodiments of the present invention will be explained in detail with reference to the drawings. In the drawings, the same or equivalent parts will be referred to with the same signs while omitting their overlapping descriptions.

The method of cutting an object to be processed in accordance with an embodiment irradiates a sheet-like object to be processed with a laser light while locating a converging point within the object, so as to form a modified region in the object along a line to cut the object. Therefore, the forming of the modified region in the method of cutting an object to be processed of this embodiment will firstly be explained with reference to FIGS. 1 to 9.

As illustrated in FIG. 1, a laser machining device 100 comprises a laser light source 101 which causes a laser light (machining laser light) L to oscillate in a pulsating manner, a dichroic mirror 103 arranged such as to change the direction of the optical axis of the laser light L by 90°, and a condenser lens 105 for converging the laser light L. The laser machining device 100 also comprises a support table 107 for supporting an object to be processed 1 irradiated with the laser light L converged by the condenser lens 105, a stage 111 for moving the support table 107 along X, Y, and Z axes, a laser light source controller 102 for controlling the laser light source 101 in order to regulate the output, pulse width, and the like of the laser light L, and a stage controller 115 for controlling the movement of the stage 111.

In the laser machining device 100, the laser light L emitted from the laser light source 101 changes the direction of its optical axis by 90° with the dichroic mirror 103 and then is converged by the condenser lens 105 into the object 1 mounted on the support table 107. At the same time, the stage 111 is shifted, so that the object 1 moves relative to the laser light L along a line to cut the object 5. This forms a modified region to become a cutting start point along the line 5 in the object 1. In the following, the modified region will be explained in detail.

Figure 2:
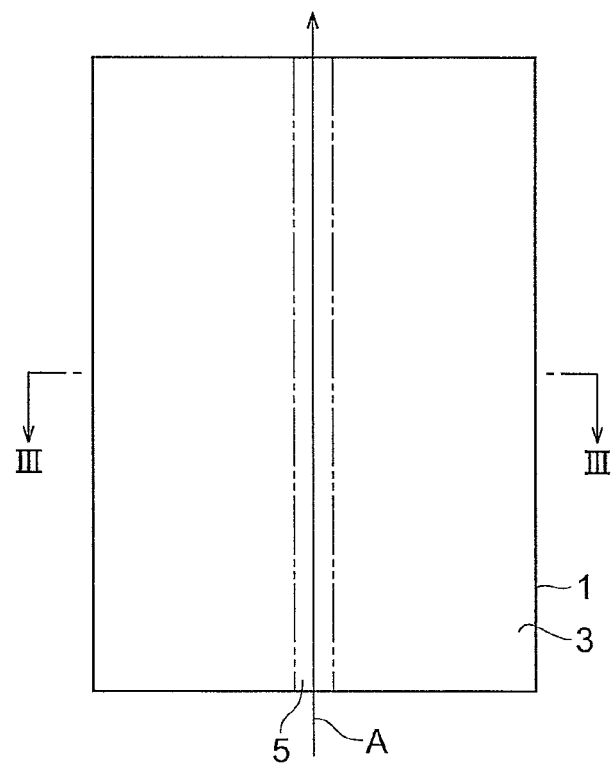
FIG. 2 is a plan view of an object to be processed in which the modified region is to be formed.
Figure 3:
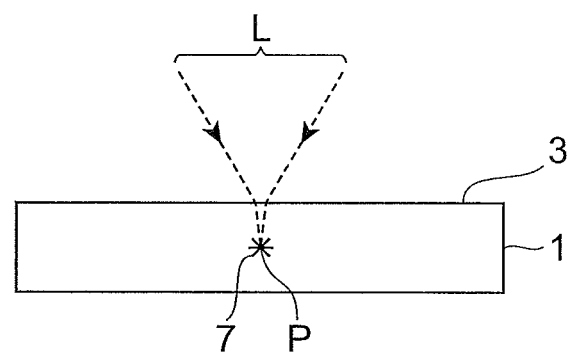
FIG. 3 is a sectional view of the object taken along the line III-III of FIG. 2.
Figure 4:
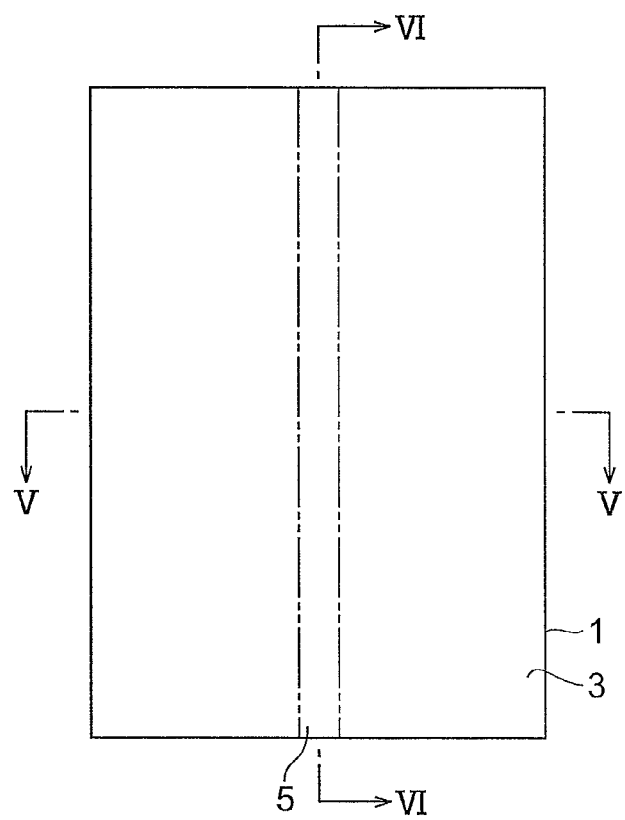
FIG. 4 is a plan view of the object after laser machining.
Figure 5:
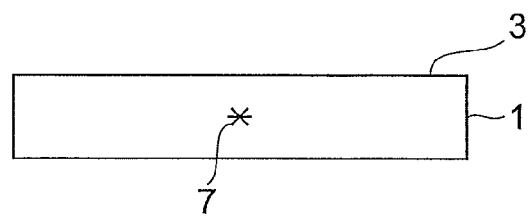
FIG. 5 is a sectional view of the object taken along the line V-V of FIG. 4.
Figure 6:
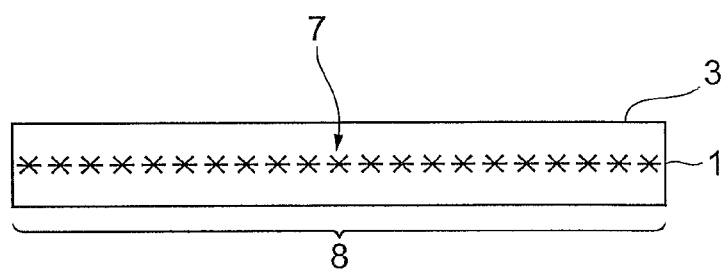
FIG. 6 is a sectional view of the object taken along the line VI-VI of FIG. 4.

As illustrated in FIG. 2, the object 1 having a sheet form has the line 5 set therein for cutting the object 1. The line 5 is a virtual line extending straight. When forming a modified region within the object 1, the laser light L is relatively moved along the line 5 (i.e., in the direction of arrow A in FIG. 2) while locating a converging point P within the object 1 as illustrated in FIG. 3. This forms a modified region 7 within the object 1 along the line 5 as illustrated in FIGS. 4 to 6, whereby the modified region 7 formed along the line 5 becomes a starting point region for cutting 8.

The converging point P is a position at which the laser light L is converged. The line 5 may be curved instead of being straight, and may be a line actually drawn on the front face 3 of the object 1 without being restricted to the virtual line. The modified region 7 may be formed either continuously or intermittently. It will be sufficient if the modified region 7 is formed at least within the object 1. There are cases where fractures are formed from the modified region 7 acting as a start point, and the fractures and modified region 7 may be exposed at outer surfaces (the front face, rear face, and outer peripheral face) of the object 1.

Here, the laser light L is absorbed in particular in the vicinity of the converging point within the object 1 while being transmitted therethrough, whereby the modified region 7 is formed in the object 1 (i.e., internal absorption type laser machining). Therefore, the front face 3 of the object 1 hardly absorbs the laser light L and thus does not melt. In the case of forming a removing part such as a hole or groove by melting it away from the front face 3, the machining region gradually progresses from the front face 3 side to the rear face side (i.e., surface absorption type laser machining) in general.

The modified region formed by the method of cutting an object to be processed in accordance with this embodiment means regions whose physical characteristics such as density, refractive index, and mechanical strength have attained states different from those of their surroundings. Examples of the modified region include (1) molten processed regions, (2) crack regions or dielectric breakdown regions, (3) refractive index changed regions, and their mixed regions.

The modified region in the method of cutting an object to be processed in accordance with this embodiment is formed by local absorption of a laser light or a phenomenon known as multiphoton absorption. A material becomes optically transparent when its absorption bandgap $E_G$ is greater than photon energy hv, so that a condition under which absorption occurs in the material is hv>$E_G$. However, even when optically transparent, the material generates absorption under a condition of nhv>$E_G$ (where n=2, 3, 4, . . . ) if the intensity of laser light becomes very high. This phenomenon is known as multiphoton absorption. The forming of a molten processed region by multiphoton absorption is disclosed, for example, in "Silicon Processing Characteristic Evaluation by Picosecond Pulse Laser", Preprints of the National Meetings of Japan Welding Society, Vol. 66 (April, 2000), pp. 72-73.

Also, modified regions formed by employing an ultrashort-pulsed laser light having a pulse width of several picoseconds to femtoseconds may be utilized as described in D. Du, X. Liu, G Korn, J. Squier, and G Mourou, "Laser Induced Breakdown by Impact Ionization in $SiO_2$ with Pulse Widths from 7 ns to 150 fs", Appl. Phys. Lett. 64(23), Jun. 6, 1994.

(1) Case where the Modified Region Includes a Molten Processed Region

An object to be processed (e.g., semiconductor material such as silicon) is irradiated with the laser light L while locating a converging point within the object under a condition with a field intensity of at least $1\times10^8$ (W/cm$^2$) at the converging point and a pulse width of 1 μs or less. As a consequence, the laser light L is absorbed in the vicinity of the converging point, so that the inside of the object is locally heated, and this heating forms a molten processed region within the object.

The molten processed region encompasses regions once molten and then re-solidified, regions just in a molten state, and regions in the process of being re-solidified from the molten state, and can also be referred to as a region whose phase has changed or a region whose crystal structure has changed. The molten processed region may also be referred to as a region in which a certain structure changes to another structure among monocrystal, amorphous, and polycrystal structures. For example, it means a region having changed from the monocrystal structure to the amorphous structure, a region having changed from the monocrystal structure to the polycrystal structure, or a region having changed from the monocrystal structure to a structure containing amorphous and polycrystal structures. When the object is of a silicon monocrystal structure, the molten processed region is an amorphous silicon structure, for example.

Figure 7:
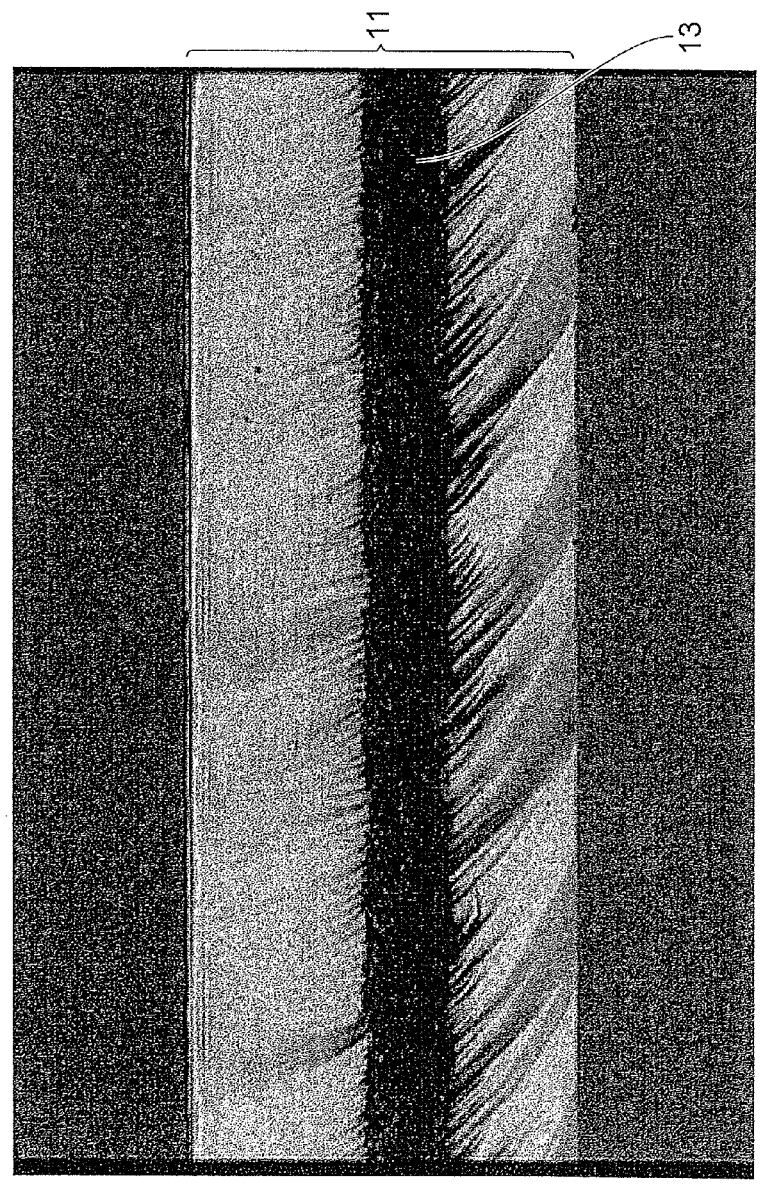
FIG. 7 is a view illustrating a photograph of a cut surface of the silicon wafer after the laser machining.

FIG. 7 is a view illustrating a photograph of a cross section in a part of a silicon wafer (semiconductor substrate) irradiated with a laser light. As illustrated in FIG. 7, a molten processed region 13 is formed within a semiconductor substrate 11.

Figure 8:
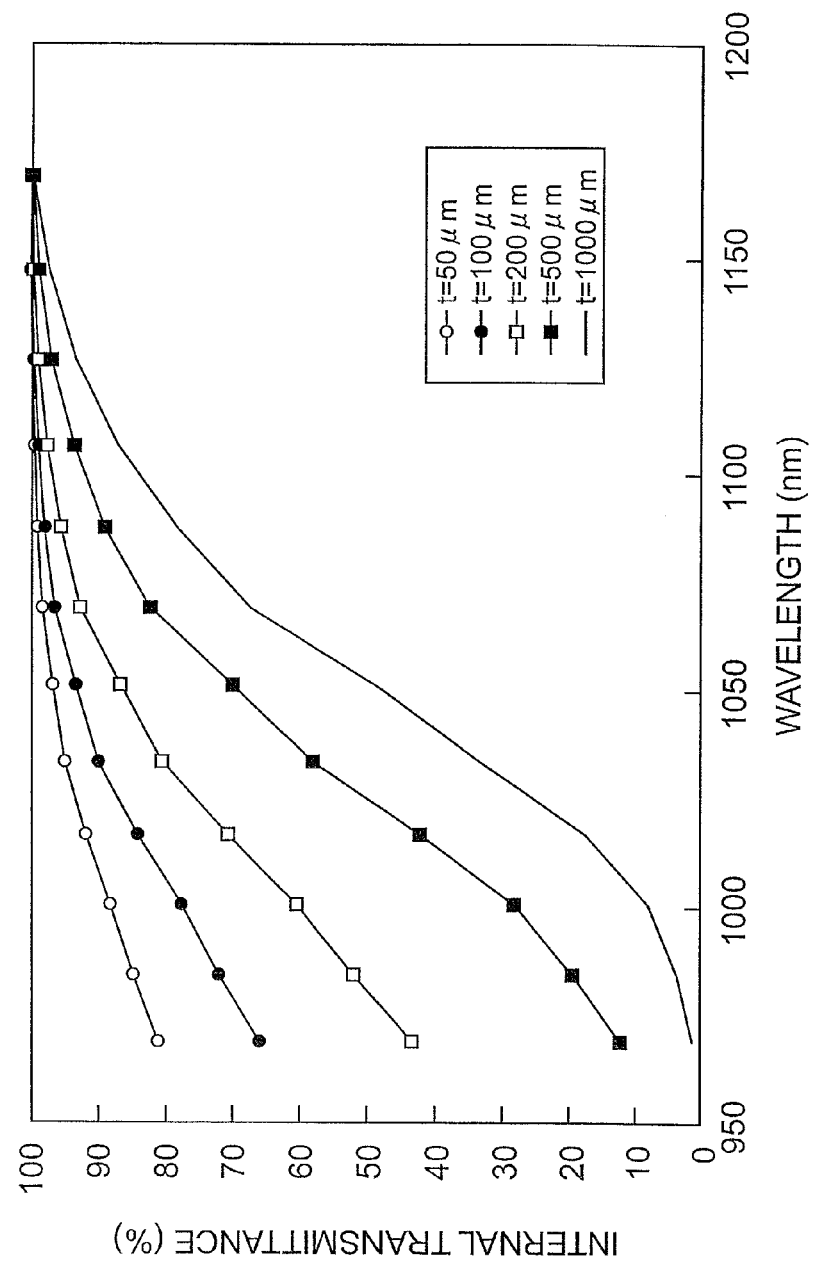
FIG. 8 is a graph illustrating relationships between the laser light wavelength and the transmittance within a silicon substrate.

The fact that the molten processed region 13 is formed within a material transparent to the wavelength of the laser light incident thereon will now be explained. FIG. 8 is a graph illustrating relationships between the laser light wavelength and the transmittance within the silicon substrate. Here, the respective reflected components on the front and rear face sides of the silicon substrate are eliminated, so as to indicate the internal transmittance alone. The respective relationships are represented in the cases where the thickness t of the silicon substrate is 50 µm, 100 µm, 200 µm, 500 µm, and 1000 µm.

For example, at the Nd:YAG laser wavelength of 1064 nm, the laser light L appears to be transmitted through the silicon substrate by at least 80% when the silicon substrate has a thickness of 500 µm or less. Since the semiconductor substrate 11 represented in FIG. 7 has a thickness of 350 µm, the molten processed region 13 is formed near the center of the semiconductor substrate 11, i.e., at a part distanced from the front face by 175 µm. The transmittance in this case is 90% or more with reference to a silicon wafer having a thickness of 200 µm, whereby the laser light L is absorbed only slightly within the semiconductor substrate 11 but substantially transmitted therethrough. When converged within the silicon wafer under the condition of at least $1 \times 10^8$ (W/cm$^2$) with a pulse width of 1 µs or less, however, the laser light L is locally absorbed at the converging point and its vicinity, whereby the molten processed region 13 is formed within the semiconductor substrate 11.

There is a case where fractures occur in the silicon wafer from the molten processed region acting as a start point. There is also a case where fractures are formed as being incorporated in the molten processed region. In the latter case, the fractures may be formed over the whole surface of the molten processed region or in only a part or a plurality of parts thereof. These fractures may grow naturally or as a force is exerted on the silicon wafer. The fractures naturally growing from the molten processed region include both of cases where they grow from a state in which the molten processed region is molten and where they grow when the molten processed region is re-solidified from the molten state. In either case, the molten processed region is formed only within the silicon wafer and, when at a cut surface, within the cut surface as illustrated in FIG. 7.

(2) Case where the Modified Region Includes a Crack Region

An object to be processed (e.g., glass or a piezoelectric material made of LiTaO$_3$) is irradiated with the laser light L while locating a converging point therewithin under a condition with a field intensity of at least $1 \times 10^8$ (W/cm$^2$) at the converging point and a pulse width of 1 µs or less. This magnitude of pulse width is a condition under which the laser light L is absorbed within the object so that a crack region is formed therein. This generates a phenomenon of optical damage within the object. This optical damage induces a thermal distortion within the object, thereby forming a crack region including a crack or a plurality of cracks within the object. The crack region may also be referred to as a dielectric breakdown region.

Figure 9:
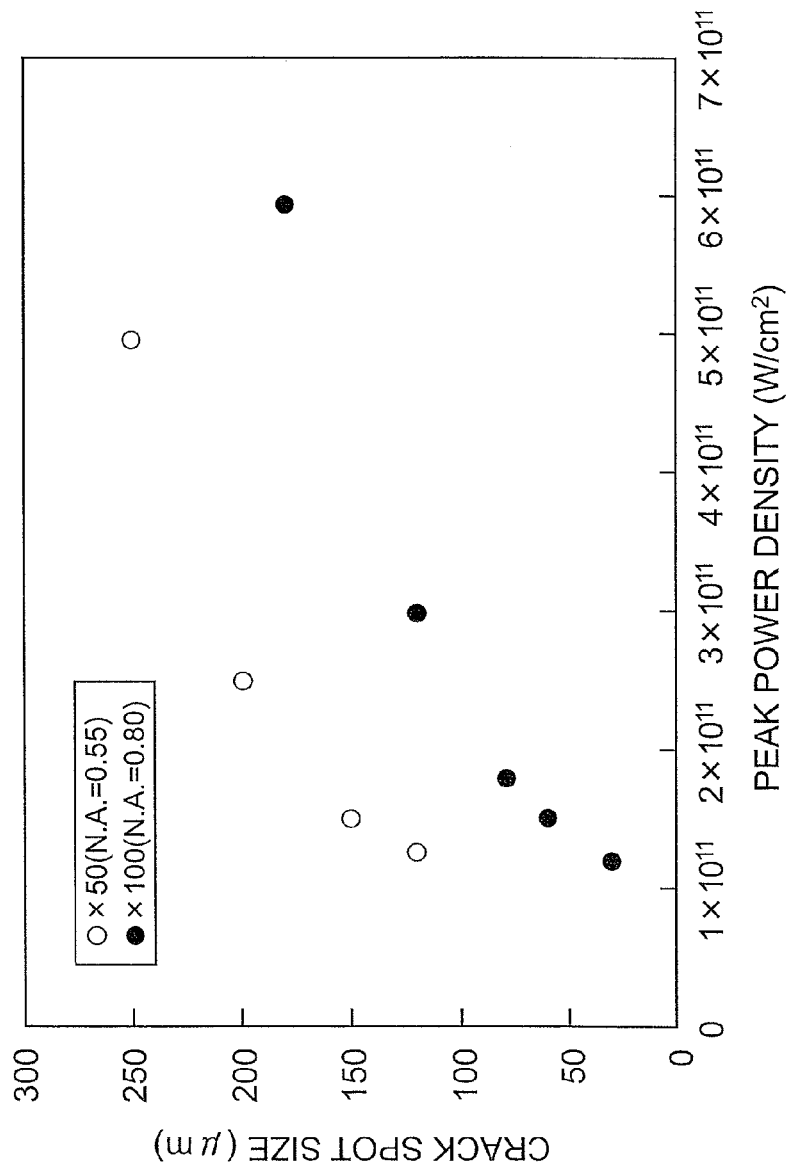
FIG. 9 is a graph illustrating relationships between the field intensity and crack spot size of the laser light.

FIG. 9 is a graph illustrating results of experiments concerning relationships between the field intensity and crack size. The abscissa indicates the peak power density. Since the laser light L is a pulsed laser light, the field intensity is represented by the peak power density. The ordinate indicates the size of a crack part (crack spot) formed within the object by one pulse of the laser light L. Crack spots gather to yield a crack region. The crack spot size is the size of a part yielding the maximum length among forms of crack spots. Data indicated by black circles in the graph represent a case where the condenser lens (C) has a magnification of ×100 and a numerical aperture (NA) of 0.80. On the other hand, data indicated by whitened circles in the graph represent a case where the condenser lens (C) has a magnification of ×50 and a numerical aperture (NA) of 0.55. Crack spots are seen to occur within the object from when the peak power density is about $10^{11}$ (W/cm$^2$) and become greater as the peak power density increases.

(3) Case where the Modified Region Includes a Refractive Index Changed Region

An object to be processed (e.g., glass) is irradiated with the laser light L while locating a converging point within the object under a condition with a field intensity of at least $1 \times 10^8$ (W/cm$^2$) at the converging point and a pulse width of 1 ns or less. When the laser light L is thus absorbed within the object while having a very short pulse width, its energy is not converted into thermal energy, whereby an eternal structure change such as ion valence change, crystallization, or orientation polarization is induced within the object, thus forming a refractive index changed region.

The modified region, which encompasses the molten processed regions, dielectric breakdown regions, refractive index changed regions, and their mixed regions, may be an area where the density of the modified region has changed from that of an unmodified region in the material or an area formed with a lattice defect. They can collectively be referred to as a high-density transitional region.

The molten processed regions, refractive index changed regions, areas where the modified region has a density different from that of the unmodified region, or areas formed with a lattice defect may further incorporate a fracture (cut or microcrack) therewithin or at an interface between the modified and unmodified regions. The incorporated fracture may be formed over the whole surface of the modified region or in only a part or a plurality of parts thereof.

When the modified region is formed as follows while taking account of the crystal structure of the object, its cleavage characteristic, and the like, the object can be cut accurately.

When the substrate is formed with an orientation flat in a direction to be formed with the above-mentioned modified region (e.g., a direction extending along a (111) plane in a monocrystal silicon substrate) or a direction orthogonal to the direction to be formed therewith, the modified region can be formed easily and accurately in the substrate with reference to the orientation flat.

Method of cutting an object to be processed in accordance with embodiments will now be explained.

First Embodiment

Figure 10:
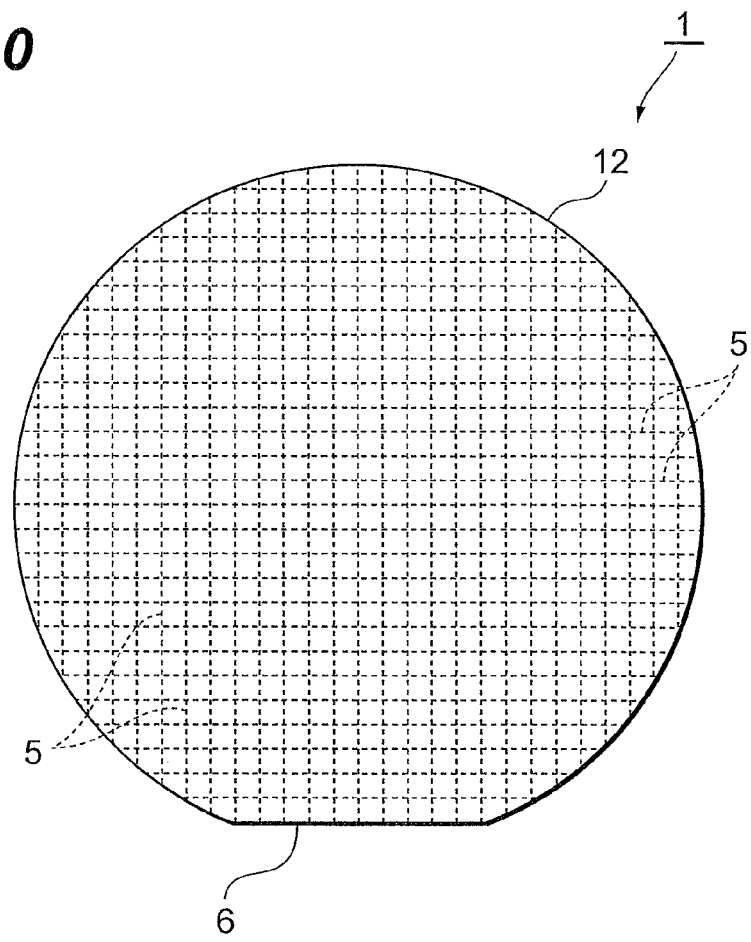
FIG. 10 is a plan view of an object to be processed to which the method of cutting an object to be processed in accordance with a first embodiment is applied.
Figure 11:
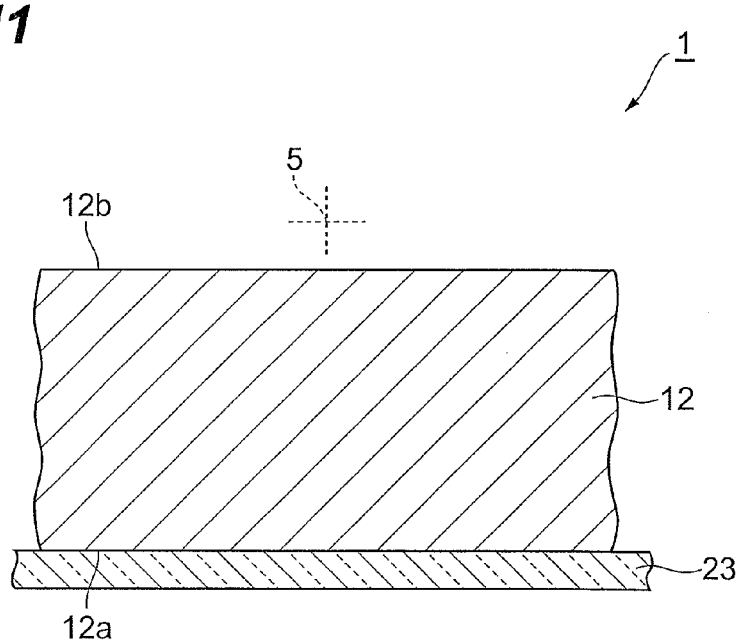
FIG. 11 is a partial sectional view taken along a line to cut the object in FIG. 10.

FIG. 10 is a plan view of an object to be processed to which the method of cutting an object to be processed in accordance with the first embodiment is applied, while FIG. 11 is a partial sectional view taken along a line to cut the object in FIG. 10. As illustrated in FIGS. 10 and 11, the sheet-like object to be processed 1 is equipped with a silicon substrate 12. The front face 12a of the object 1 (i.e., the front face of the silicon substrate 12) is formed with a functional device layer (not depicted) including a plurality of functional devices.

The silicon substrate 12 has a monocrystal structure in which, assuming the front face 12a to be a (100) plane, a plane parallel to the orientation flat 6 is a (110) plane. A number of functional devices, examples of which include semiconductor operating layers formed by crystal growth, light-receiving devices such as photodiodes, light-emitting devices such as laser diodes, and circuit devices formed as circuits, are formed like a matrix in directions parallel and perpendicular to the orientation flat 6 of the silicon substrate 12.

The method of cutting an object to be processed in accordance with the first embodiment is applied to thus constructed object 1.

First, as illustrated in FIG. 11, an expandable tape 23 is attached to the front face 12a of the object 1. Subsequently, the object 1 is secured onto the support table (not depicted) of the laser machining device such that the rear face 12b of the object 1 (i.e., the rear face of the silicon substrate 12) faces up. Then, as illustrated in FIG. 10, lines to be cut the object 5 passing between adjacent functional devices are set like grids in directions perpendicular and parallel to the orientation flat 6.

Figure 12:
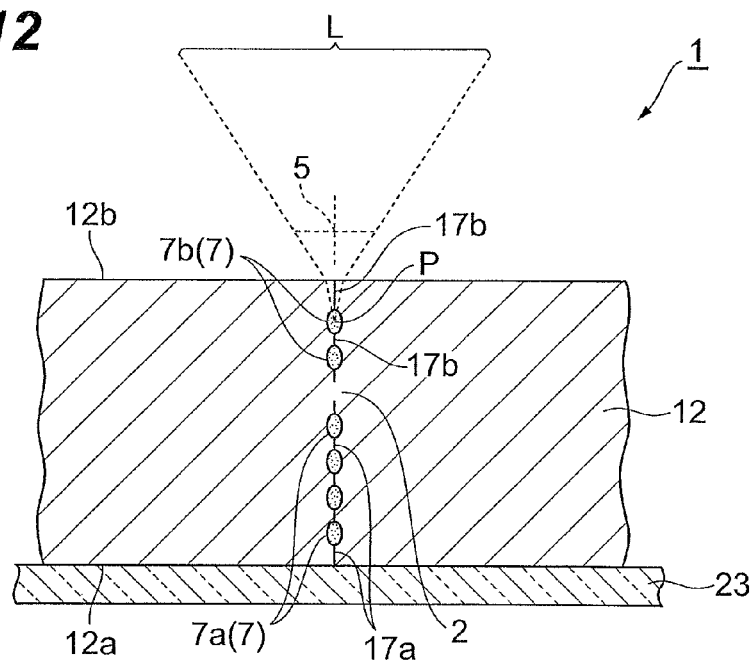
FIG. 12 is a partial sectional view of the object for explaining the method of cutting an object to be processed in accordance with the first embodiment.

Next, as illustrated in FIG. 12, the object 1 is irradiated with the laser light L while using the rear face 12b as a laser light entrance surface and locating the converging point P within the silicon substrate 12, and the support table is shifted, so as to move the converging point P relatively along the lines 5 set like grids in the directions perpendicular and parallel to the orientation flat 6. The converging point P is relatively moved along each line 5 a plurality of times while locating the converging point P at respective distances from the rear face 12b, so as to form a plurality of rows of modified regions 7 within the silicon substrate 12 one by one sequentially from the front face 12a side for each line 5.

Preferably, the wavelength of the laser light L is 1080 nm or more. Using the laser light L having a wavelength of 1080 nm or more can raise the transmittance in the silicon substrate 12, so as to reduce the number of rows of modified regions 7 formed in the thickness direction of the silicon substrate 12, thereby shortening the takt time.

Preferably, the laser light L has such a wavelength that the internal transmittance excluding the respective reflection components of the front face 12a and rear face 12b of the silicon substrate 12 with respect to the thickness of the silicon substrate 12 is at least 90%. It is unrealistic for a dicing machine to be equipped with a plurality of laser light sources corresponding to wafer thicknesses, while a laser light source which is capable of fine machining and adapted to change the wavelength according to the wafer thicknesses does not exist. The dicing machine is required to cut all the thicknesses of wafers from thin wafers to thick wafers. Therefore, it is preferred that a laser light source having a transmittance of 90% based on a thick wafer be employed. Since the thick wafer is assumed to have a thickness of 300 μm or more, a laser light having a wavelength of 1080 nm or more at which a silicon wafer having a thickness of 300 μm exhibits a transmittance of about 90%, or a laser having a wavelength of 1100 nm or more in the case where the silicon wafer has a thickness of 500 μm, is desired to be employed in the dicing machine.

The forming of modified regions 7 along the lines 5 parallel to the orientation flat 6 will now be explained in more detail. First, as illustrated in FIG. 12, a plurality (four rows here) of rows of modified regions (first modified regions) 7a are formed within the silicon substrate 12 one by one sequentially from the front face 12a side for each line 5, by which fractures (first fractures) 17a are generated from the modified regions 7a to the front face 12a of the object 1 along the line 5.

Subsequently, on the rear face 12b side of the object 1 with respect to the modified regions 7a, a plurality (two rows here) of modified regions (second modified regions) 7b are formed within the silicon substrate 12 one by one for each line 5 while being separated from the modified regions 7a by an unmodified region 2, by which fractures (second fractures) 17b are generated from the modified regions 7b to the rear face 12b of the object 1 along the line 5 so as not to connect with the fractures 17a in the unmodified region 2. Here, the fractures 17a, 17b do not connect with each other in the unmodified region 2. That is, the cutting has not been completed yet, so that the object 1 has not been cut completely along the line 5.

The unmodified region 2 is a region having a monocrystal structure. By contrast, the modified regions 7a, 7b include a molten processed region which is a region having changed from a monocrystal structure to an amorphous structure, a region having changed from the monocrystal structure to a polycrystal structure, or a region having changed from the monocrystal structure to a structure including the amorphous and polycrystal structures.

Figure 13:
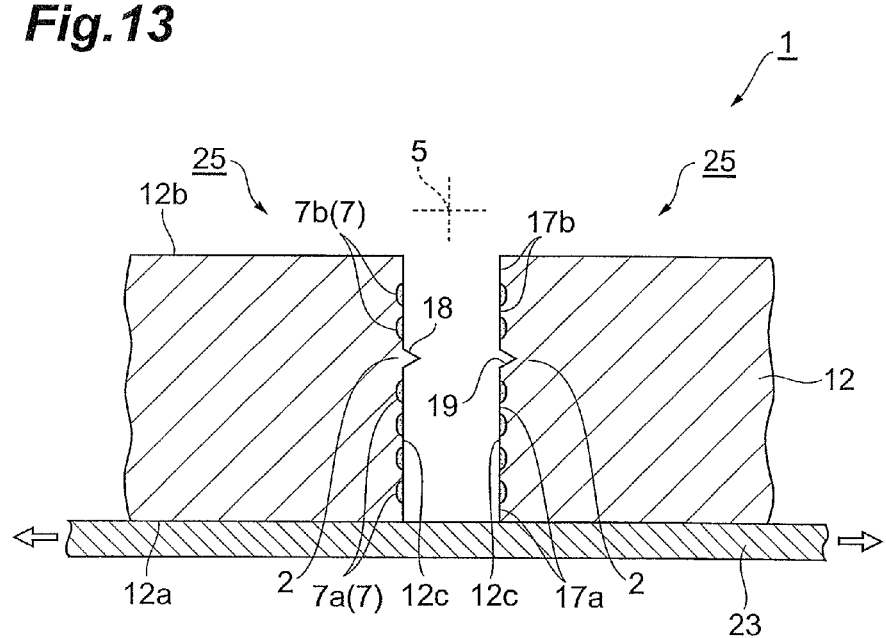
FIG. 13 is a partial sectional view of the object for explaining the method of cutting an object to be processed in accordance with the first embodiment.

Subsequent to the forming of the modified regions 7, the expandable tape 23 is expanded as illustrated in FIG. 13. As the expandable tape is expanded, a force acts on the object 1 in such directions as to expand the latter, so that the object 1 is cut into chips from the modified regions 7 acting as a start point, whereby a number of semiconductor chips 25 each having one functional device are obtained. Since the expandable tape 23 is in the expanded state here, the semiconductor chips 25 are separated from each other.

In the lines 5 parallel to the orientation flat 6, as illustrated in FIG. 13, the expandable tape 23 is expanded, so as to generate a stress in the object 1, thereby connecting the fractures 17a, 17b to each other in the unmodified region 2, thus cutting the object 1 into the semiconductor chips 25. Here, in a pair of cut surfaces 12c, 12c of the object 1 cut along the line 5, the unmodified region 2 of one cut surface 12c is formed with a projection 18 extending in a direction substantially orthogonal to the thickness direction of the silicon substrate 12, while the unmodified region 2 of the other cut surface 12c is formed with a depression 19 complementary to the projection 18.

Since the front face 12a of the silicon substrate 12 is a (100) plane while planes parallel to the orientation flat 6 are (110) planes, the cut surface 12c becomes a (110) plane in the line 5 parallel to the orientation flat 6. Here, each of the projection 18 and depression 19 is formed with a V-shaped cross section, while the slopes forming the projection 18 and depression 19 are (111) planes. The fractures between the modified regions 7 and the front face 12a (or rear face 12b) are formed in directions different from crystal planes, while cuts occur (cleave) in directions along crystal planes in a part of the unmodified region 2 between the modified regions 7, whereby the wafer is cut.

As explained in the foregoing, while the unmodified region 2 is interposed between the modified regions 7a, 7b, the object method of cutting an object to be processed in accordance with the first embodiment generates the fractures 17a from the modified regions 7a to the front face 12a of the object 1 and the fractures 17b from the modified regions 7b to the rear face 12b of the object 1. This can prevent fractures from advancing continuously in the thickness direction of the silicon substrate 12 even when the laser light L having a wavelength of 1064 nm or more is used in order to reduce the number of rows of modified regions 7 formed in the thickness direction of the silicon substrate 12. The method of cutting an object to be processed in accordance with this embodiment causes a stress in the object 1, so as to connect the fractures 17a, 17b to each other in the unmodified region 2, thereby cutting the object 1. This can prevent fractures from meandering in the rear face 12b of the object 1 and so forth, whereby the object 1 can be cut accurately along the lines 5. As in the foregoing, the method of cutting an object to be processed in accordance with the first embodiment can accurately cut the sheet-like object to be processed 1 equipped with the silicon substrate 12 along the lines 5, while reducing the number of rows of modified regions 7 formed in the thickness direction of the silicon substrate 12 along the lines 5.

The method of cutting an object to be processed in accordance with the first embodiment forms the modified regions 7a, 7b such that, in a pair of cut surfaces 12c, 12c of the object 1 cut along the line 5, the unmodified region 2 in one cut surface 12c is formed with the projection 18 extending in a direction substantially orthogonal to the thickness direction of the silicon substrate 12, while the unmodified region 2 in the other cut surface 12c is formed with the depression 19 corresponding to the projection 18. At the same time, the method of cutting an object to be processed in accordance with the first embodiment forms the modified regions 7a, 7b such that, assuming the front face of the silicon substrate 12 to be a (100) plane, the cut surfaces 12c are (110) planes, and the surfaces forming the projection 18 and depression 19 are (111) planes. Thus forming the first and second modified regions 7a, 7b can not only cut the object 1 along the line 5 accurately, but also suppress the height of the projection 18 and the depth of the depression 19 when cutting the object 1 along the line 5, so as to yield smooth cut surfaces 12c.

Preferably, the projection 18 and depression 19 are formed only in the unmodified region 2 interposed between the modified regions 7a, 7b in the cut surfaces 12c. For example, forming the projection 18 and depression 19 between the modified regions 7a, 7a adjacent to each other in the thickness direction or between the modified regions 7b, 7b adjacent to each other in the thickness direction is unfavorable in that the accuracy in cutting may be lowered thereby. Also, forming the projection 18 and depression 19 between the front face 12a of the object 1 and the modified region 7a or between the rear face 12b of the object 1 and the modified region 7b is unfavorable in that it may generate chipping and cracking.

Examples of the method of cutting an object to be processed in accordance with the present invention will now be explained.

Figure 14:
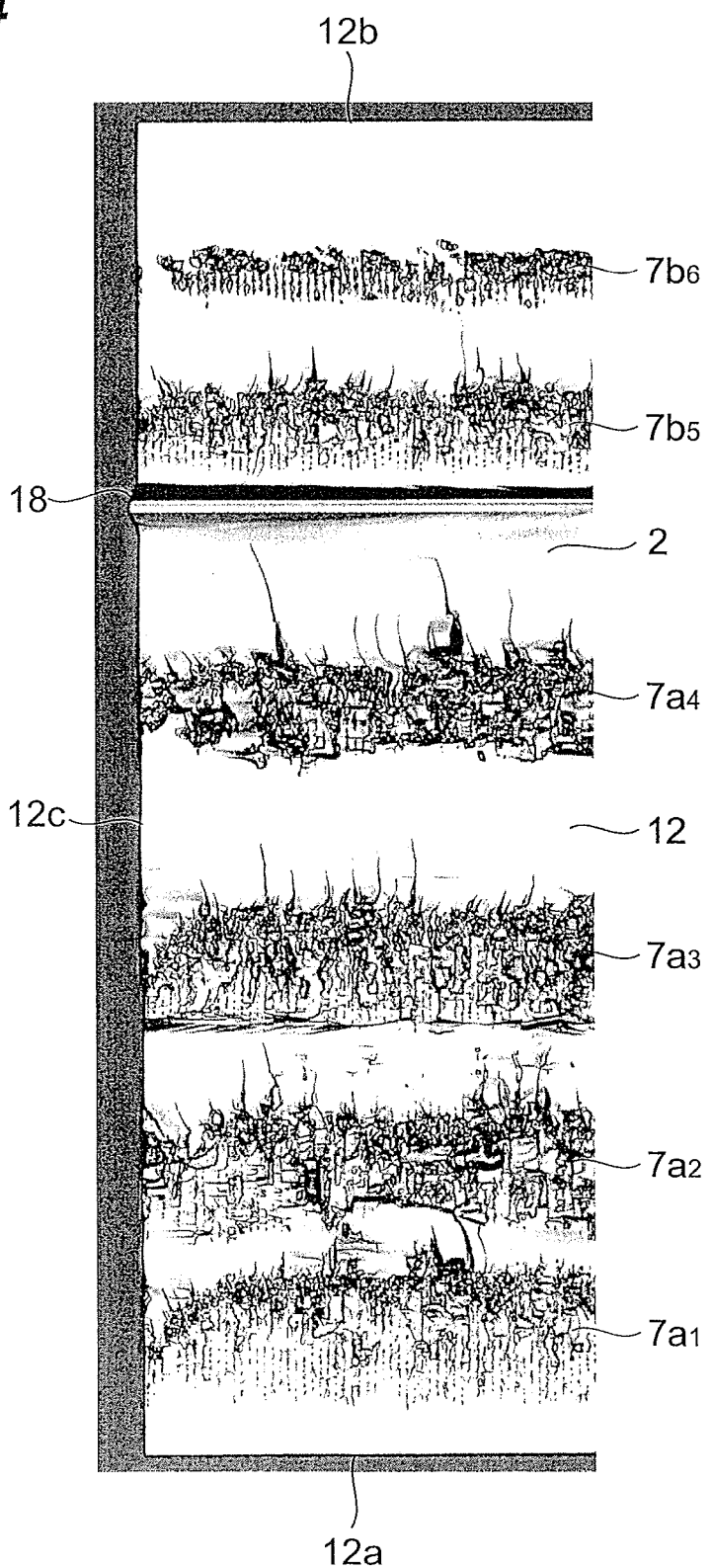
FIG. 14 is a view illustrating a photograph of a cut surface of a silicon substrate having a thickness of 625 μm cut from six rows of modified regions acting as a start point.

FIG. 14 is a view illustrating a photograph of a cut surface of a silicon substrate having a thickness of 625 μm cut from six rows of modified regions acting as a start point. As illustrated in FIG. 14, modified regions $7a_1$ to $7a_4$ for generating fractures in the front face 12a of the silicon substrate 12 and modified regions $7b_5$, $7b_6$ for generating fractures in the rear face 12b of the silicon substrate 12 were formed in the cut surface 12c of the silicon substrate 12 along a line to be cut the object so as to be arranged in the thickness direction of the silicon substrate 12. A projection 18 was formed in the unmodified region 2 between the modified regions $7a_4$, $7b_5$ in the cut surface 12c. Here, the front face 12a and the cut surface 12c were (100) and (110) planes, respectively, whereby the surfaces forming the projection 18 were (111) planes.

When forming the modified regions $7a_1$ to $7a_4$, $7b_5$, $7b_6$, while using the rear face 12b of the silicon substrate 12 as a laser light entrance surface and pulse-oscillating the laser light L having a wavelength of 1342 nm at a pulse width of 90 ns and a frequency of 90 kHz, the converging point P of the laser light L was moved relative to the silicon substrate 12 along the line at a machining speed of 340 mm/s. As a consequence, the distance (machining pitch) between modified spots each formed by irradiation with one pulse of the laser light L was 3.78 μm. The other conditions were as shown in Table 1. In Table 1, the converging point position is the distance from the rear face 12b of the silicon substrate 12 serving as the laser light entrance surface to the position where the converging point P of the laser light L is located, while the width of each modified region is the average value of widths of the modified region in the thickness direction of the silicon substrate 12 (ditto in Tables 3 and 4 which will be explained later).

[Table 1]

TABLE 1

| | Converging Point position (μm) | Modified region width (μm) | Laser light energy (μJ) |
|---|---|---|---|
| Modified region $7a_1$ | 593 | 56 | 15 |
| Modified region $7a_2$ | 523 | 56 | 15 |
| Modified region $7a_3$ | 422 | 53 | 15 |
| Modified region $7a_4$ | 306 | 50 | 15 |
| Modified region $7b_5$ | 162 | 36 | 8 |
| Modified region $7b_6$ | 92 | 33 | 8 |

Figure 15:
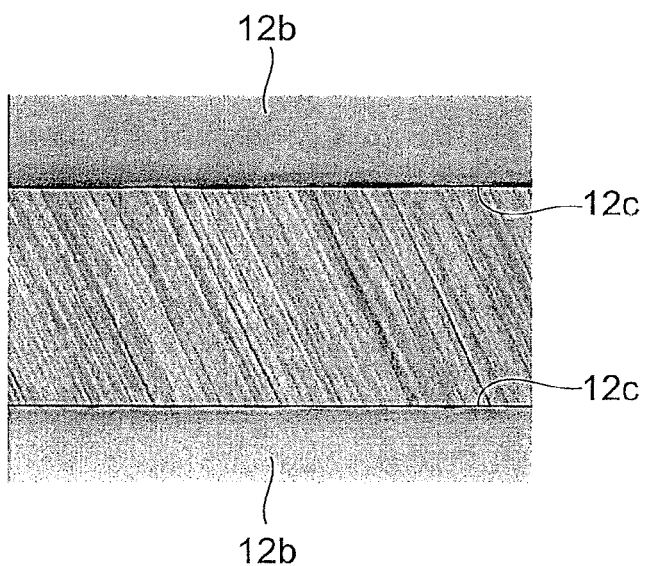
FIG. 15 is a view illustrating a photograph of the cut surface of the silicon substrate in FIG. 14 as seen from the rear side.

In this example, as illustrated in FIG. 15, the meandering generated in a pair of opposing cut surfaces 12c, 12c was about 3 μm at a maximum in the rear face 12b, whereby the accuracy in cutting the silicon substrate 12 was maintained. Forming the projection 18 (or depression 19) in the unmodified region 2 of the cut surface 12c improved the bending strength of chips obtained by cutting the silicon substrate 12.

Figure 16:
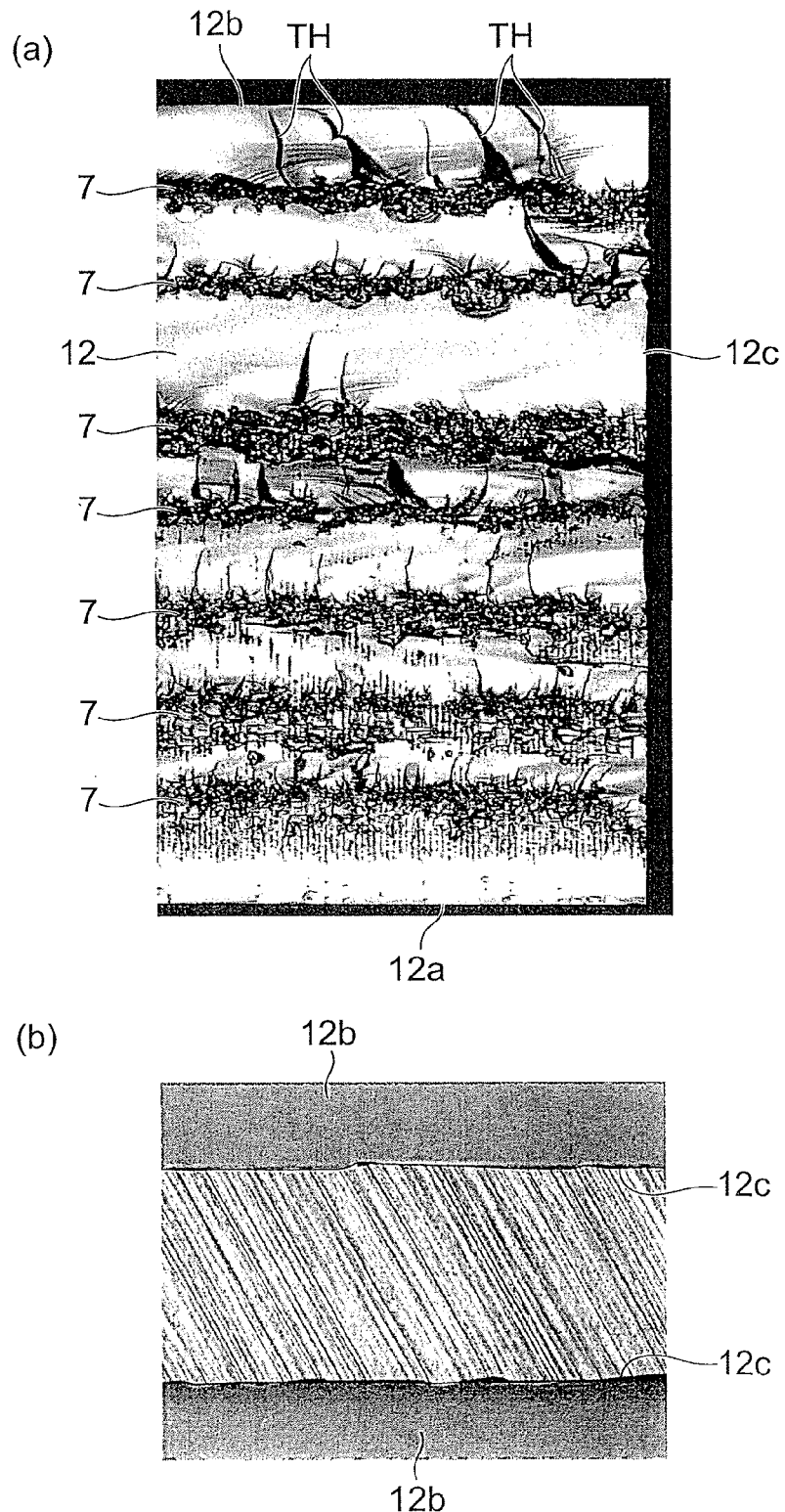
FIG. 16 is a view illustrating a photograph of a cut surface of a silicon substrate cut by a comparative example.

When seven rows of modified regions 7 were formed in the thickness direction of the silicon substrate 12 along the line as illustrated in FIG. 16(a), by contrast, the meandering generated in a pair of opposing cut surfaces 12c, 12c was about 20 μm at a maximum in the rear face 12b as illustrated in FIG. 16(b), whereby the accuracy in cutting the silicon substrate 12 deteriorated.

This is because the use of the laser light L having a wavelength of 1342 nm makes the modified regions 7 greater but causes fractures to advance continuously from the front face 12a of the silicon substrate 12 to the rear face 12b thereof (i.e., does not break the connection between the fractures 17a, 17b in the unmodified region 2 as in the example mentioned above). When fractures continuously advance from the front face 12a of the silicon substrate 12 to the rear face 12b, twist hackles TH which are cuts whose directivity is hard to control occur at the time of forming the last modified region 7 located closest to the rear face 12b and reach the rear face 12b as illustrated in FIG. 16(a), whereby the meandering of the cut surfaces 12c becomes greater in the rear face 12b. When the meandering of the cut surfaces 12c becomes greater in the rear face 12b, particles occur by a larger amount, which also becomes a problem.

Figure 17:
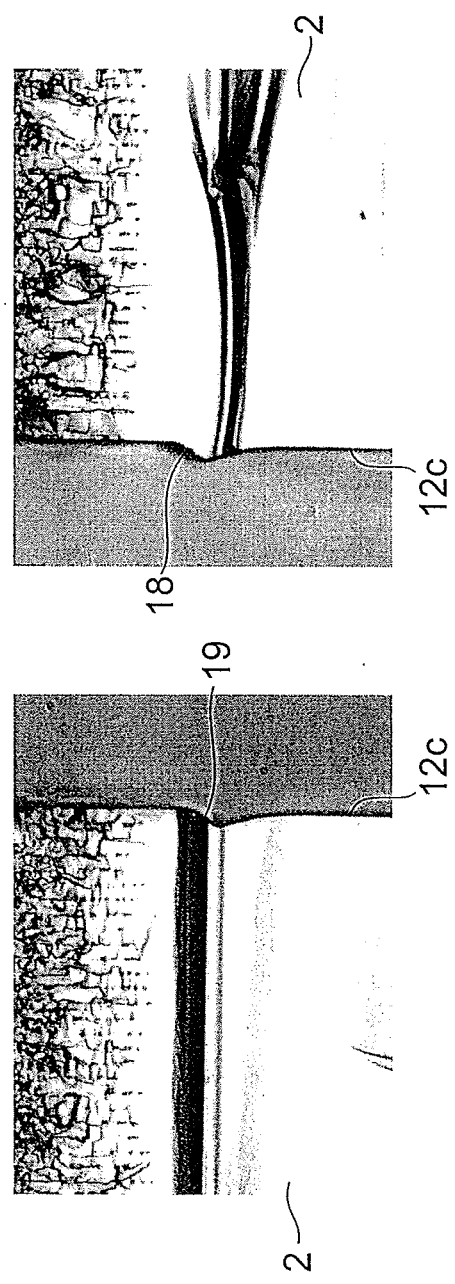
FIG. 17 is a view illustrating a photograph of a projection and a depression which were formed in an unmodified region in a cut surface substantially orthogonal to the cut surface of FIG. 14.

FIG. 17 is a view illustrating a photograph of a projection and a depression which were formed in an unmodified region in a cut surface substantially orthogonal to the cut surface of FIG. 14. As illustrated in FIG. 17, in a pair of cut surfaces 12c, 12c, the unmodified region 2 of one cut surface 12c was formed with the projection 18 having a V-shaped cross section extending in a direction substantially orthogonal to the thickness direction of the silicon substrate 12, while the unmodified region 2 of the other cut surface 12c was formed with the depression 19 having a V-shaped cross section complementary to the projection 18.

Figure 18:
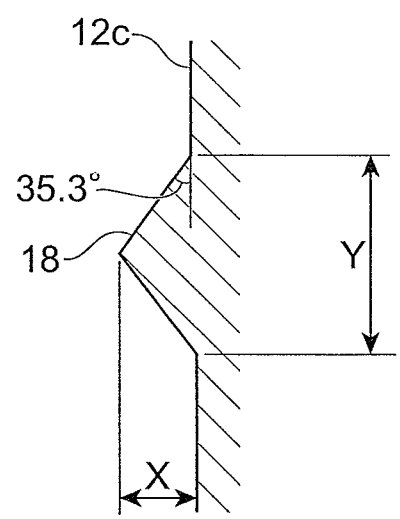
FIG. 18 is a schematic view illustrating the projection in FIG. 17.

FIG. 18 is a schematic view illustrating the projection in FIG. 17. As illustrated in FIG. 18, letting X and Y be the height of the projection 18 and the width of the projection 18 in the thickness direction of the silicon substrate 12, respectively, the results shown in Table 2 were obtained. Here, the angle between each slope ((111) plane) forming the projection 18 and the cut surface 12c ((110) plane) was 35.3°.

TABLE 2

|    | X (μm) | Y (μm) | Cut accuracy | Cut residue |
|----|--------|--------|--------------|-------------|
| #1 | 0      | 0      | bad          | no          |
| #2 | 2      | 6      | good         | no          |
| #3 | 4      | 11     | good         | no          |
| #4 | 6      | 17     | good         | no          |
| #5 | 8      | 23     | bad          | no          |
| #6 | 10     | 28     | bad          | yes         |

As illustrated in Table 2, the meandering generated in the cut surface 12c was about 20 μm at a maximum in the case of #1, thus yielding a poor result in the accuracy in cutting. In each of the cases of #5 and #6, the depression or projection in the cut surface 12c exceeded 8 μm, thereby yielding a poor result in the accuracy in cutting. In the case of #6, a cut residue (a phenomenon that the silicon substrate 12 was not completely cut along all the lines set like grids) also occurred.

By contrast, the cases of #2 to #4 yielded good results concerning the cutting accuracy without cut residue. Hence, the modified regions 7a, 7b are preferably formed such that the projection 18 has a thickness of 2 μm to 6 μm and a width of 6 μm to 17 μm in the thickness direction of the silicon substrate 12. Thus forming the modified regions 7a, 7b can not only prevent fractures from meandering in the rear face 12b of the silicon substrate 12 and so forth but also avoid cut residues at the time of cutting the silicon substrate 12 along the line.

Figure 19:
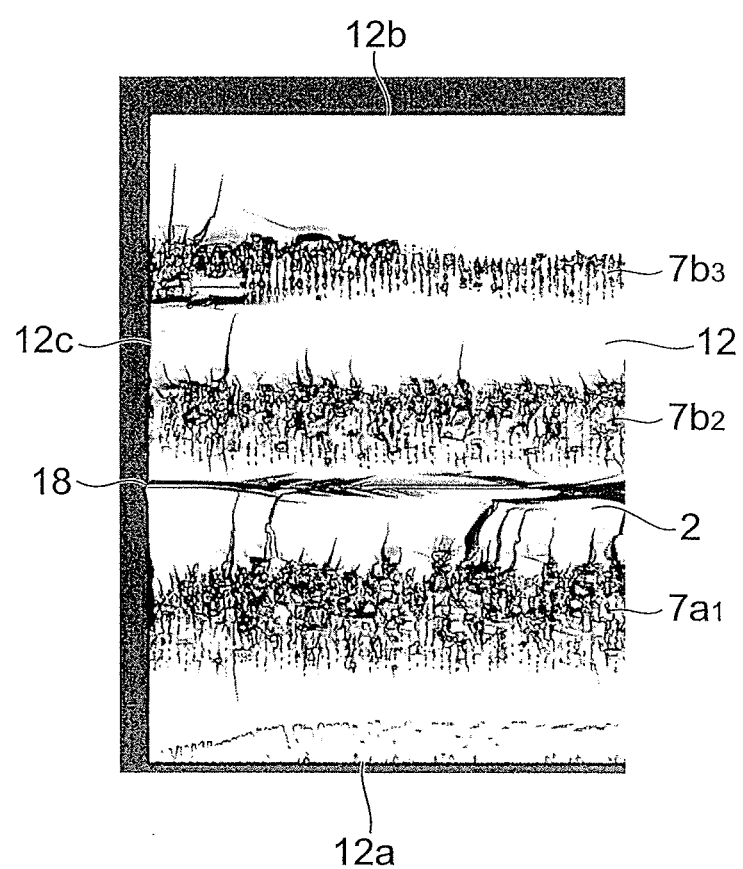
FIG. 19 is a view illustrating a photograph of a cut surface of a silicon substrate having a thickness of 300 μm cut from three rows of modified regions acting as a start point.

FIG. 19 is a view illustrating a photograph of a cut surface of a silicon substrate having a thickness of 300 μm cut from three rows of modified regions acting as a start point. As illustrated in FIG. 19, a modified region $7a_1$ for generating fractures in the front face 12a of the silicon substrate 12 and modified regions $7b_2$, $7b_3$ for generating fractures in the rear face 12b of the silicon substrate 12 were formed in the cut surface 12c of the silicon substrate 12 along a line to cut so as to be arranged in the thickness direction of the silicon substrate 12. A projection 18 was formed in the unmodified region 2 between the modified regions $7a_1$, $7b_2$ in the cut surface 12c. Here, the front face 12a and the cut surface 12c were (100) and (110) planes, respectively, whereby the surfaces forming the projection 18 were (111) planes.

When forming the modified regions $7a_1$, $7b_2$, $7b_3$, while using the rear face 12b of the silicon substrate 12 as a laser light entrance surface and pulse-oscillating the laser light L having a wavelength of 1342 nm at a pulse width of 90 ns and a frequency of 90 kHz, the converging point P of the laser light L was moved relative to the silicon substrate 12 along the line at a machining speed of 340 mm/s. As a consequence, the distance (machining pitch) between modified spots each formed by irradiation with one pulse of the laser light L was 3.78 μm. The other conditions were as shown in Table 3.

TABLE 3

|                       | Converging Point position (μm) | Modified region width (μm) | Laser light energy (μJ) |
|-----------------------|--------------------------------|-----------------------------|-------------------------|
| Modified region $7a_1$ | 253                            | 43                          | 12                      |
| Modified region $7b_2$ | 163                            | 36                          | 8                       |
| Modified region $7b_3$ | 92                             | 30                          | 8                       |

Figure 20:
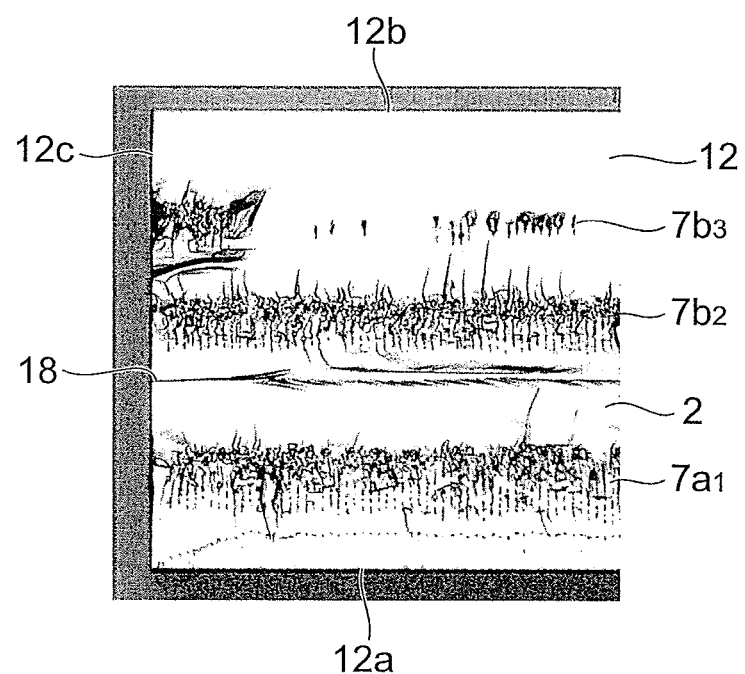
FIG. 20 is a view illustrating a photograph of a cut surface of a silicon substrate having a thickness of 200 μm cut from three rows of modified regions acting as a start point.

FIG. 20 is a view illustrating a photograph of a cut surface of a silicon substrate having a thickness of 200 μm cut from three rows of modified regions acting as a start point. As illustrated in FIG. 20, a modified region $7a_1$ for generating fractures in the front face 12a of the silicon substrate 12 and modified regions $7b_2$, $7b_3$ for generating fractures in the rear face 12b of the silicon substrate 12 were formed in the cut surface 12c of the silicon substrate 12 along a line to cut the object so as to be arranged in the thickness direction of the silicon substrate 12. A projection 18 was formed in the unmodified region 2 between the modified regions $7a_1$, $7b_2$ in the cut surface 12c. Here, the front face 12a and the cut surface 12c were (100) and (110) planes, respectively, whereby the surfaces forming the projection 18 were (111) planes.

When forming the modified regions $7a_1$, $7b_2$, $7b_3$, while using the rear face 12b of the silicon substrate 12 as a laser light entrance surface and pulse-oscillating the laser light L having a wavelength of 1342 nm at a pulse width of 90 ns and a frequency of 90 kHz, the converging point P of the laser light L was moved relative to the silicon substrate 12 along the line at a machining speed of 340 mm/s. As a consequence, the distance (machining pitch) between modified spots each formed by irradiation with one pulse of the laser light L was 3.78 μm. The other conditions were as shown in Table 4.
[Table 4]

TABLE 4

|                       | Converging Point position (μm) | Modified region width (μm) | Laser light energy (μJ) |
|-----------------------|--------------------------------|-----------------------------|-------------------------|
| Modified region $7a_1$ | 178                            | 29                          | 6                       |
| Modified region $7b_2$ | 103                            | 22                          | 4                       |
| Modified region $7b_3$ | 60                             | 20                          | 4                       |

These examples were able to break the connection between the fractures 17a, 17b in the unmodified region 2, so as to cut the silicon substrate 12 accurately along the lines.

As explained in the foregoing examples, it is important that the connection between the fractures 17a, 17b in the unmodified region 2 be broken in order to cut the silicon substrate 12 accurately along the lines when the laser light having a wavelength of 1064 nm or more is used so as to reduce the number of rows of modified regions 7 formed in the thickness direction of the silicon substrate 12. Table 5 shows conditions for forming such an unmodified region 2. In Table 5, the width of each unmodified region is the average value of widths of the unmodified region in the thickness direction of the silicon substrate 12 (i.e., distances between the end part on the rear face 12b side of the modified region 7a located closest to the rear face 12b in the modified regions 7a for generating fractures in the front face 12a of the silicon substrate 12 (the sole modified region 7a when there is only one modified region 7a) and the end part on the front face 12a side of the modified region 7b located closest to the front face 12a in the modified regions 7b for generating fractures in the front face 12a of the silicon substrate 12 (the sole modified region 7b when there is only one modified region 7b)).

TABLE 5

| Silicon substrate thickness (μm) | Number of rows of modified regions 7a | Number of rows of modified regions 7b | Unmodified region width (μm) |
|---|---|---|---|
| 625 | 4~5 | 12~20 | 70~110 |
| 300 | 1~2 | 8~13 | 34~64 |
| 200 | 1~2 | 5~8 | 32~54 |

Preferably, as shown in Table 5, the modified regions 7a, 7b are formed such that the width of the unmodified region 2 in the thickness direction of the silicon substrate 12 is 10% to 30% of the thickness of the silicon substrate 12. Thus forming the modified regions 7a, 7b can prevent meandering of fractures in the rear face 12b of the silicon substrate 12 and cut residues at the time of cutting the silicon substrate 12 along the lines, whereby the silicon substrate 12 can be cut accurately and reliably along the lines.

The present invention is not limited to the first embodiment. For example, while the first embodiment uses the rear face 12b of the object 1 as the laser light entrance surface, the front face 12a of the object 1 may be employed as the laser light entrance surface.

Second Embodiment

Figure 21:
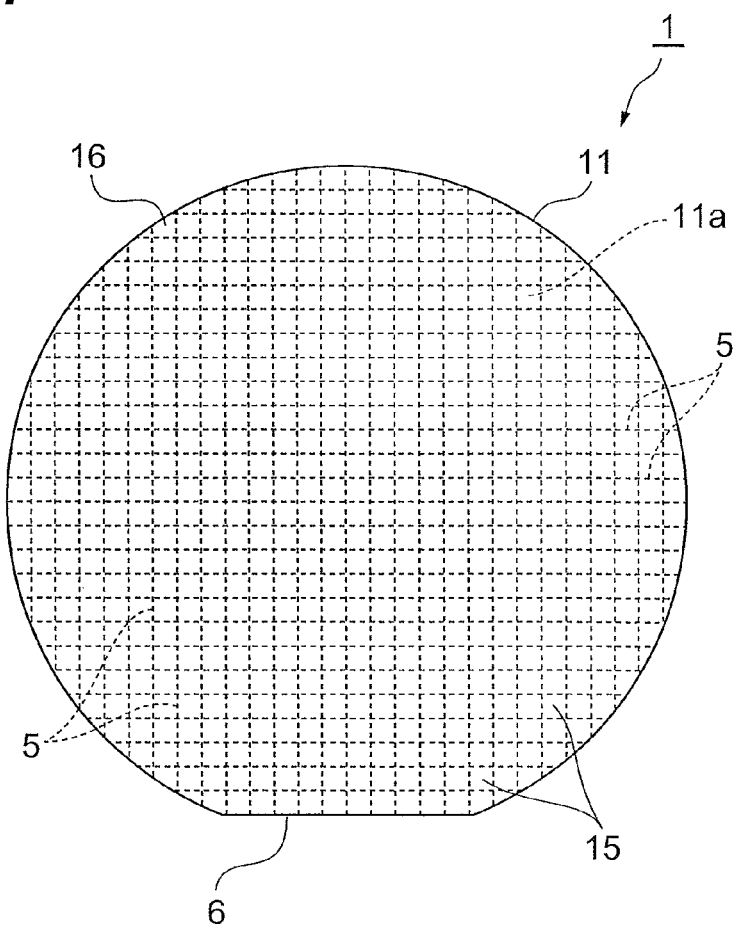
FIG. 21 is a plan view of an object to be processed to which the method of cutting an object to be processed in accordance with a second embodiment is applied.

FIG. 21 is a plan view of an object to be processed to which the method of cutting an object to be processed in accordance with the second embodiment is applied. As illustrated in FIG. 21, a sheet-like object to be processed 1 comprises a silicon substrate 11 and a functional device layer 16 formed on a front face 11a of the silicon substrate 11.

The functional device layer 16 includes a plurality of functional devices 15 formed into a matrix in directions parallel and perpendicular to an orientation flat 6 of the silicon substrate 11. Examples of the functional devices 15 include semiconductor operating layers formed by crystal growth, light-receiving devices such as photodiodes, light-emitting devices such as laser diodes, and circuit devices formed as circuits.

Lines to cut the object 5 are set like grids so as to pass between adjacent functional devices 15, 15 in the object 1. The object 1 is cut along the lines 5, whereby thus cut individual chips become semiconductor devices each having one functional device 15.

Figure 22:
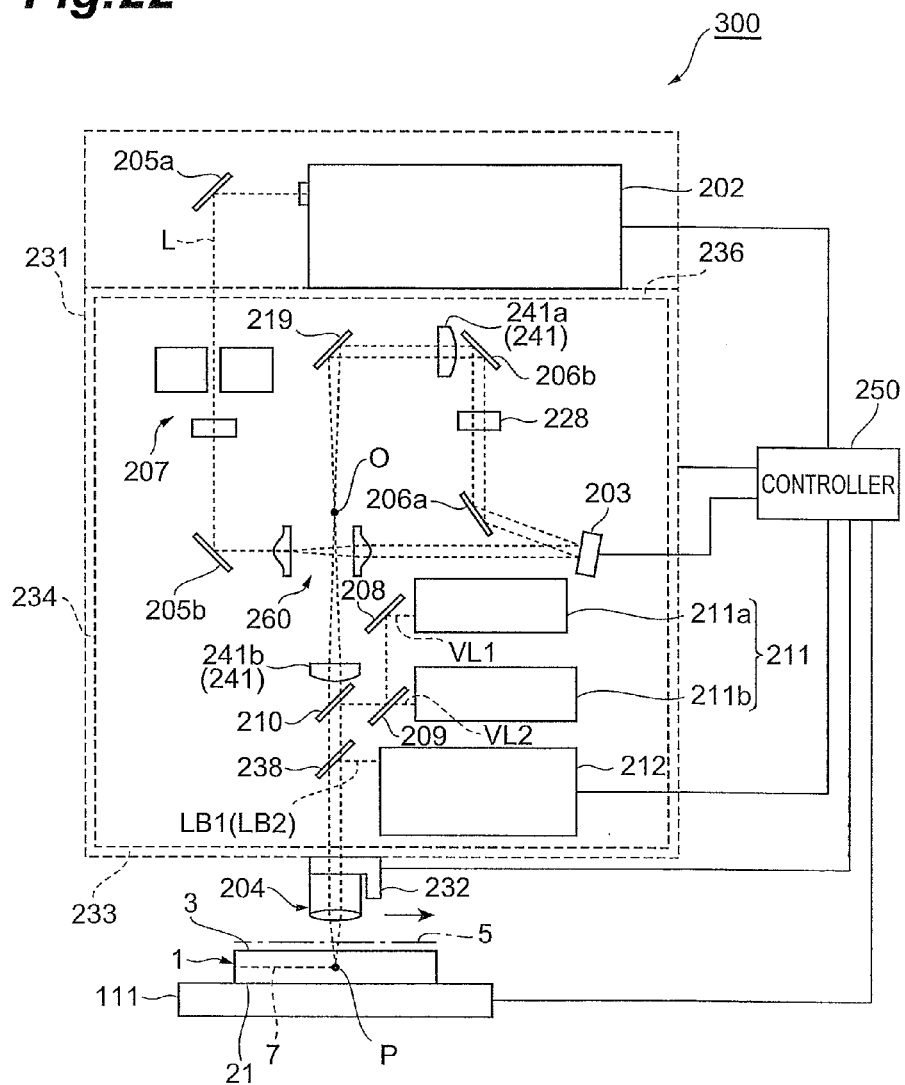
FIG. 22 is a structural diagram of a laser machining device used for performing the method of cutting an object to be processed in accordance with the second embodiment.

FIG. 22 is a structural diagram of a laser machining device used for performing the method of cutting an object to be processed in accordance with the second embodiment. As illustrated in FIG. 22, this laser machining device 300 comprises a laser light source 202, a reflective spatial light modulator 203, a 4f optical system 241, and a condenser optical system 204. The reflective spatial light modulator 203, 4f optical system 241, and condenser optical system 204 are accommodated in a housing 234, while the laser light source 204 is contained in an enclosure 231 surrounding the housing 234.

The laser light source 202, for which a fiber laser is used, for example, emits a laser light L which is a pulsed laser light having a wavelength of 1080 nm or more, for example. Here, the laser light source 202 is secured to a top panel 236 of the housing 234 by screws and the like such as to emit the laser light L horizontally.

The reflective spatial light modulator 203, for which a spatial light modulator (SLM) made of a reflective liquid crystal (LCOS: Liquid Crystal on Silicon) is used, for example, modulates the laser light L emitted from the laser light source 202. Here, the reflective spatial light modulator 203 modulates the horizontally incident laser light L while reflecting it obliquely upward with respect to the horizontal direction.

Figure 23:
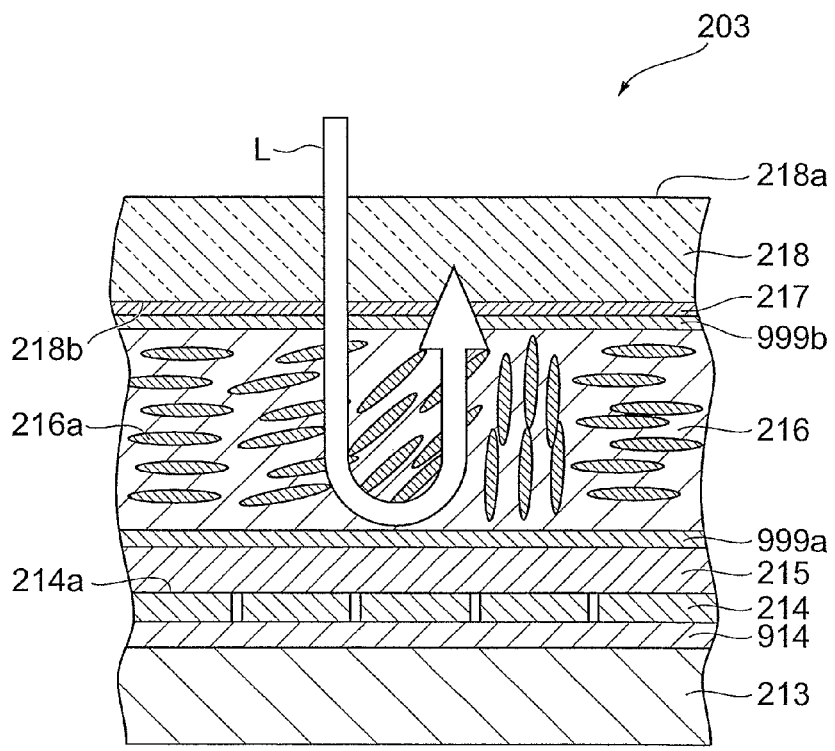
FIG. 23 is a partial sectional view of a reflective spatial light modulator in FIG. 22.

FIG. 23 is a partial sectional view of a reflective spatial light modulator in FIG. 22. As illustrated in FIG. 23, the reflective spatial light modulator 203 comprises a silicon substrate 213, a drive circuit layer 914, a plurality of pixel electrodes 214, a reflective film 215 such as a dielectric multilayer mirror, an alignment film 999a, a liquid crystal layer 216, an alignment film 999b, a transparent conductive film 217, and a transparent substrate 218 such as a glass substrate which are stacked in this order.

The transparent substrate 218 has a front face 218a extending along the XY plane and constituting the front face of the reflective spatial light modulator 203. The transparent substrate 218 is mainly composed of a light transmissive material such as glass and transmits therethrough the laser light L having a predetermined wavelength entering from the front face 218a of the reflective spatial light modulator 203 to the inside of the reflective spatial light modulator 203. The transparent conductive film 217 is formed on the rear face 218b of the transparent substrate 218 and mainly composed of a conductive material transparent to the laser light L (e.g., ITO).

The plurality of pixel electrodes 214 are arranged two-dimensionally on the silicon substrate 213 along the transparent conductive film 217 according to the arrangement of a plurality of pixels. Each pixel electrode 214 is made of a metal material such as aluminum, while its front face 214a is machined flat and smooth. The plurality of pixel electrodes 214 are driven by an active matrix circuit provided in the drive circuit layer 914.

The active matrix circuit, which is disposed between the plurality of pixel electrodes 214 and the silicon substrate 213, controls a voltage applied to each pixel electrode 214 according to a light image to be issued from the reflective spatial light modulator 203. An example of such an active matrix circuit has a first driver circuit for controlling the voltage applied to each pixel row arranged along the X axis and a second drive circuit for controlling the voltage applied to each pixel row arranged along the Y axis, which are not depicted, and is configured such that the controller 250 causes both driver circuits to apply a predetermined voltage to the pixel electrode 214 of a designated pixel.

The alignment films 999a, 999b are placed at both end faces of the liquid crystal layer 216 and align a liquid crystal molecule group in a fixed direction. As the alignment films 999a, 999b, those made of a polymer material such as polyimide, for example, whose contact surfaces with the liquid crystal layer 216 have been subjected to rubbing or the like are employed.

The liquid crystal layer 216, which is disposed between the plurality of pixel electrodes 214 and the transparent conductive film 217, modulates the laser light L according to an electric field formed by each pixel electrode 214 and the transparent conductive film 217. That is, when the active matrix circuit applies a voltage to a pixel electrode 214, an electric field is formed between the transparent conductive film 217 and the pixel electrode 214.

This electric field is applied to each of the reflective film 215 and liquid crystal layer 216 by a ratio corresponding to the thickness thereof. The direction of alignment of liquid crystal molecules 216a changes according to the level of the electric field applied to the liquid crystal layer 216. The laser light L entering the liquid crystal layer 216 through the transparent substrate 218 and transparent conductive film 217, if any, is modulated by the liquid crystal molecules 216a while passing through the liquid crystal layer 216, reflected by the reflective film 215, modulated by the liquid crystal layer 216 again, and then taken out.

This adjusts the wavefront of the laser light L entering and passing through a modulation pattern (modulation image), thereby yielding a shift in phases of rays constituting the laser light L in their components in a predetermined direction orthogonal to the advancing direction thereof.

Returning to FIG. 22, the 4f optical system 241 adjusts the wavefront form of the laser light L modulated by the reflective spatial light modulator 203. The 4f optical system 241 has a first lens 241a and a second lens 241b.

The lenses 241a, 241b are disposed between the reflective spatial light modulator 203 and the condenser optical system 204 such that the distance (optical path length) between the reflective spatial light modulator 203 and the first lens 241a becomes a focal length f1 of the first lens 241a, the distance (optical path length) between the condenser optical system 204 and the lens 241b becomes a focal length f2 of the lens 241b, the distance (optical path length) between the first and second lenses 241a, 241b becomes f1+f2, and the first and second lenses 241a, 241b form a double-sided telecentric optical system. This 4f optical system 241 can inhibit the laser light L modulated by the reflective spatial light modulator 203 from changing its wavefront form as it propagates through the space and increasing aberration.

The condenser optical system 204 converges the laser light L modulated by the 4f optical system 241 into the object 1. The condenser optical system 204 includes a plurality of lenses and is attached to a bottom panel 233 of the housing 234 through a drive unit 232 including a piezoelectric element or the like.

The laser machining device 300 also comprises, within the enclosure 231, a surface observation unit 211 for observing the front face 3 of the object 1 and an AF (AutoFocus) unit 212 for finely adjusting the distance between the condenser optical system 204 and the object 1.

The surface observation unit 211 has an observation light source 211a for emitting a visible light VL1 and a detector 211b for receiving and detecting a reflected light VL2 of the visible light VL1 reflected by the front face 3 of the object 1. In the surface observation unit 211, the visible light VL1 emitted from the observation light source 211a is reflected by or transmitted through a mirror 208 and dichroic mirrors 209, 210, 238 and converged by the condenser optical system 204 onto the object. Subsequently, the reflected light VL2 reflected by the front face 3 of the object 1 is converged by the condenser optical system 204, transmitted through or reflected by the dichroic mirrors 238, 210, and then transmitted through the dichroic mirror 209, so as to be received by the detector 211b.

The AF unit 212 emits an AF laser light LB1 and receives and detects a reflected light LB2 of the AF laser light LB1 reflected by the front face 3 of the object 1, thereby acquiring data on varying levels of the front face 3 (position (height) data of the front face 3 in the thickness direction of the object 1) along the lines 5. When forming the modified region 7, the AF unit 212 drives the drive unit 232 according to the acquired data on varying levels, so as to move the condenser optical system 204 back and forth in its optical axis direction along undulations of the front face 3 of the object 1.

The laser machining device 300 further comprises the controller 250 constituted by a CPU, a ROM, a RAM, and the like as one for controlling the laser machining device 300. The controller 250 controls the laser light source 202 and regulates the output, pulse width, and the like of the laser light L emitted from the laser light source 202. The controller 250 controls the positions of the enclosure 231 and stage 111 and the driving of the drive unit 232 such that a simultaneous converging position of the laser light L is located at a predetermined distance from the front face 3 of the object 1 and relatively moves along the lines 5 when forming the modified region 7.

When forming the modified region 7, the controller 250 applies a predetermined voltage between each pixel electrode 214 and the transparent conductive film 217 in the reflective spatial light modulator 203, so as to cause the liquid crystal layer 216 to display a predetermined modulation pattern. As a consequence, the reflective spatial light modulator 203 can modulate the laser light L as desired.

A case where the object 1 is machined by the laser machining device 300 will now be explained. An example which will to explained is a case where the sheet-like object to be processed 1 is irradiated with the laser light L while locating the converging point P within the object 1, so as to form the modified region to become a cutting start point within the object 1 along the lines 5.

First, an expandable tape is attached to the rear face 21 of the object 1, and the object 1 is mounted on the stage 111. Subsequently, while using the front face 3 of the object 1 as a laser light entrance surface and irradiating the object 1 with the laser light L in a pulsating manner, the laser light L is moved (scanned) relative to the object 1 along the lines 5, so as to form the modified region 7.

That is, in the laser machining device 300, the laser light L emitted from the laser light source 202 advances horizontally within the enclosure 231 and then is reflected downward by a mirror 205a, so that its optical intensity is adjusted by an attenuator 207. This laser light L is horizontally reflected by a mirror 205b, homogenized in terms of the intensity distribution by a beam homogenizer 260, and then made incident on the reflective spatial light modulator 203.

The laser light L incident on the reflective spatial light modulator 203 is transmitted through the modulation pattern displayed by the liquid crystal layer 216, so as to be modulated according to the modulation pattern, and then emitted obliquely upward with respect to the horizontal direction. Subsequently, the laser light L is reflected upward by a mirror 206a and then, after its direction of polarization is changed by a half-wave plate 228 into a direction along the line 5, horizontally reflected by a minor 206b, so as to enter the 4f optical system 241.

Next, the wavefront form of the laser light L is adjusted such that it becomes parallel light when entering the condenser optical system 204. Specifically, the laser light L is transmitted through and converged by the first lens 241a, reflected downward by a mirror 219, and diverged through a confocal point O. The diverged laser light L is transmitted through the second lens 241b and converged thereby again so as to become parallel light.

Subsequently, the laser light L is transmitted through the dichroic minors 210, 218 in sequence, so as to enter the condenser optical system 204, and converged by the condenser optical system 204 into the object 1 mounted on the stage 111. As a result, a modified spot is formed at a predetermined depth in the thickness direction within the object 1.

Then, the converging point P of the laser light L is relatively moved along the lines 5, so as to form the modified region 7 by a plurality of modified spots. Thereafter, the expandable tape is expanded, so as to cut the object 1 along the lines 5 from the modified region 7 acting as a cutting start point, whereby a plurality of cut chips are obtained as semiconductor devices (e.g., memories, IC, light-emitting devices, and light-receiving devices).

Figure 24:
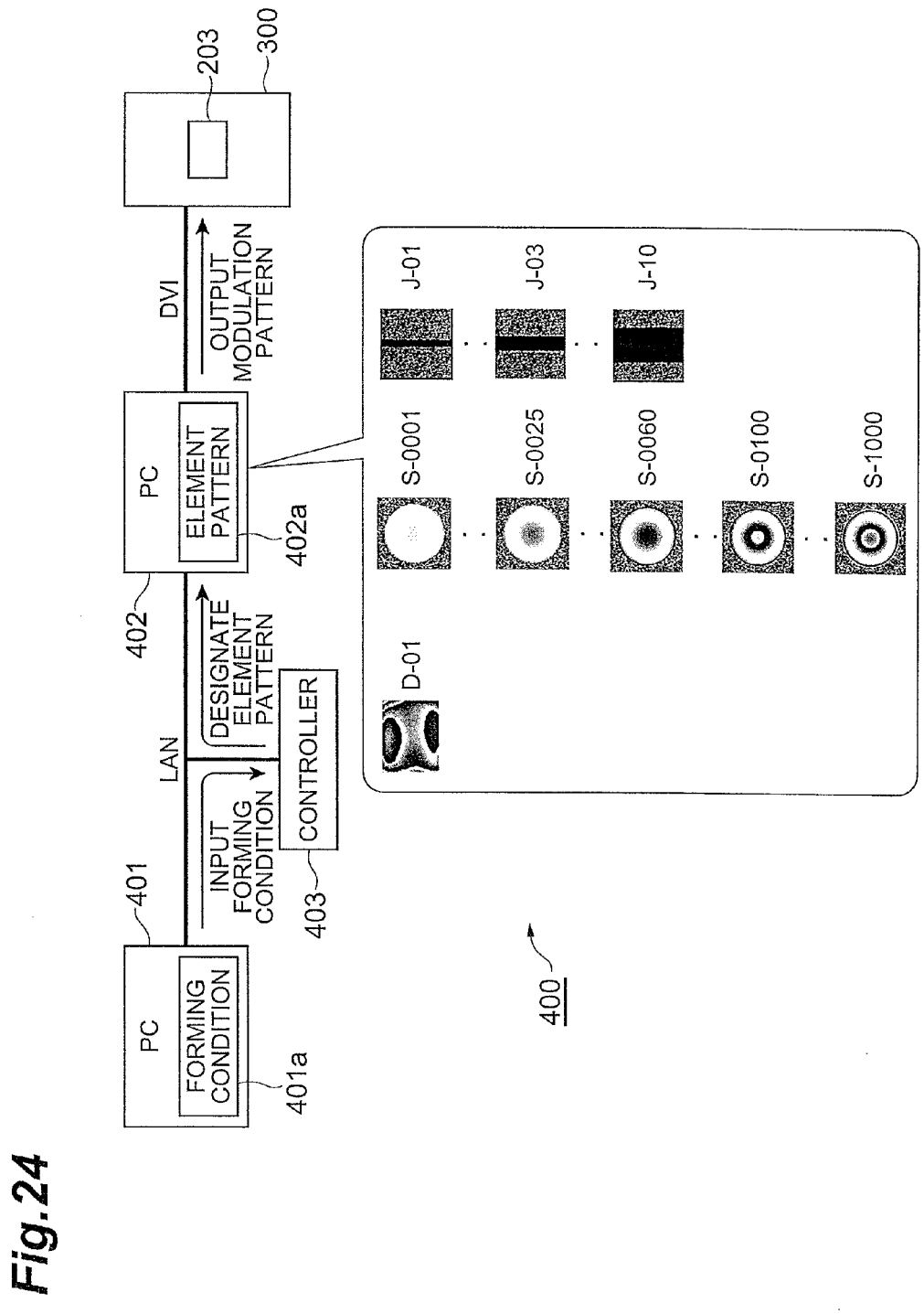
FIG. 24 is a structural diagram of a laser machining system equipped with the laser machining device of FIG. 22.

A laser machining system 400 equipped with the above-mentioned laser machining device 300 will now be explained. As illustrated in FIG. 24, the laser machining system 400 comprises personal computers (hereinafter referred to as "PC") 401, 402, a controller 403, and the laser machining device 300. As mentioned above, the laser machining device 300 irradiates the object 1 with the laser light L modulated by the reflective spatial light modulator 203, so as to form the modified region 7 in the object 1.

A storage unit (memory, hard disk, or the like) 401a of the PC 401 stores conditions for forming the modified region 7 for the object 1 as a database. When a user operates the PC 401, so as to input a desirable forming condition, the forming condition is fed into the controller 403 through a LAN (Local Area Network).

The controller (pattern designation means) 403 selects one or a plurality of kinds of element patterns for the modified region 7 in response to the condition for forming the modified region 7 fed therein for the object 1 and designates this element pattern for the PC 402 through the LAN. Here, the element pattern is a pattern which becomes an element of a modulation pattern for applying a predetermined modulation to the laser light L in the reflective spatial light modulator 203 of the laser machining device 300. A plurality of kinds of element patterns are stored in a storage unit (memory, hard disk, or the like) 402a of the PC 402 as a database.

The storage unit (pattern storage means) 402a stores an individual difference correction pattern (D-01) for correcting individual differences occurring in the laser machining device 300 (e.g., distortions occurring in the liquid crystal layer 216 of the reflective spatial light modulator 203) as an element pattern. The storage unit 402a also stores spherical aberration correction patterns (S-0001 to S-1000) for correcting the spherical aberration occurring at the converging point P of the laser light L as element patterns. Since the spherical aberration occurring at the converging point P of the laser light L varies depending on the material of the object 1 and the distance from the laser light entrance surface of the object 1 to the converging point P of the laser light L, the spherical aberration correction patterns set the material and distance as parameters and are stored in the storage unit 402a.

Figure 25:
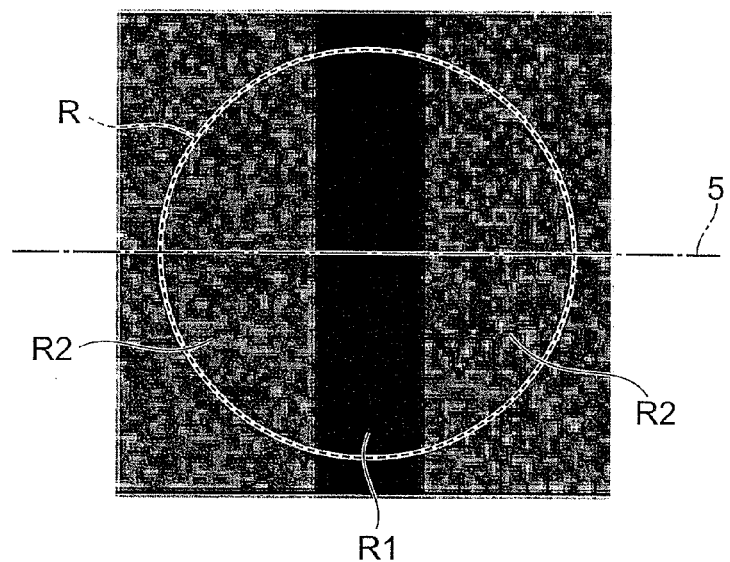
FIG. 25 is a view illustrating a quality pattern used in the laser machining system of FIG. 24.

The storage unit 402a further stores quality patterns (J-01 to J-10) as element patterns. As illustrated in FIG. 25, each quality pattern has a first lightness region R1 extending in a direction substantially orthogonal to the line 5 and second lightness regions R2 located on both sides of the first lightness region R1 in the extending direction of the line 5.

In the case where modified regions 7 are formed at a position on the rear face 21 side of the object 1, a position on the front face 3 side of the object 1, and an intermediate position between the position on the rear face 21 side and the position on the front face 3 side in the order of the position on the rear face 21 side, the intermediate position, and the position on the front face 3 side (or in the order of position on the front face 3 side, the intermediate position, and the position on the rear face 21 side), the quality pattern is used when forming the modified region 7 at the intermediate position. That is, the quality pattern is used when forming the modified region 7 at the intermediate position after forming the modified region 7 at the position on the rear face 21 side before forming the modified region 7 at the position on the front face 3 side (or after forming the modified region 7 at the position on the front face 3 side before forming the modified region 7 at the position on the rear face 21 side).

Forming the modified region 7 at the position on the rear face 21 side means forming the modified region 7 such that the center position of the modified region 7 is biased from the center position of the object 1 toward the rear face 21 of the object 1. Forming the modified region 7 at the position on the front face 3 side means forming the modified region 7 such that the center position of the modified region 7 is biased from the center position of the object 1 toward the front face 3 of the object 1. Forming the modified region 7 at the intermediate position between the position on the rear face 21 side and the position on the front face 3 side means forming the modified region between the modified region 7 formed at the position on the rear face 21 side and the modified region 7 formed at the position on the front face 3 side (i.e., does not mean forming the modified region 7 such that the center position of the modified region 7 coincides with the center position of the object 1 in the thickness direction of the object 1).

Returning to FIG. 24, the PC (pattern preparation means) 402 reads one or a plurality of kinds of element patterns for the modified region 7 from the storage unit 402a according to the element patterns designated by the controller 403. That is, the PC 402 acquires one or a plurality of element patterns for the modified region 7 from the storage unit 402a according to the forming condition of the modified region 7 with respect to the object 1.

Upon acquiring one kind of element pattern, the PC 402 employs the one kind of element pattern as a modulation pattern for forming its corresponding modified region 7. Upon acquiring a plurality of kinds of element patterns, the PC 402 employs a combined pattern combining the plurality of kinds of element patterns as a modulation pattern for forming their corresponding modified region 7. After thus preparing the modulation pattern, the PC 402 outputs the modulation pattern in association with the modified region 7 to the laser machining device 300 through a DVI (Digital Visual Interface).

When forming a plurality of kinds of modified regions 7 in the object 1 (e.g., when forming a plurality of rows of modified regions 7 aligning in the thickness direction of the object 1 for one line 5), the PC 402 prepares a modulation pattern for each of all kinds of the modified regions 7 and then outputs the modulation patterns in association with the respective modified regions 7 to the laser machining device 300.

The above-mentioned quality patterns will now be explained in more details. As illustrated in FIG. 25, in the extending direction of the line 5, the width of the first lightness region R1 is 20% to 50% of the width of an effective region R for modulating the laser light L in the modulation pattern. However, in the extending direction of the line 5, the width of the first lightness region R1 may be narrower than the width of each of the second lightness regions R2 (see, for example, J-01 in FIG. 24) or wider than the width of each of the second lightness regions R2 (see, for example, J-10 in FIG. 24). Here, the effective region R of the quality pattern is a region corresponding to the part of the laser light L incident on the condenser optical system 204 (the part incident on the entrance pupil of the condenser optical system 204).

Any of the average lightness of the first lightness region R1 and the average lightness of the first lightness region R2 may be higher than the other as long as they are different from each other. From the viewpoint of increasing the lightness difference between the first lightness region R1 and the second lightness region R2, when the lightness of each pixel constituting the quality pattern is expressed by 256 gradations, it is preferred that the average lightness of the first lightness region R1 and the average lightness of the second lightness region R2 deviate from each other by 128 gradations.

Figure 26:
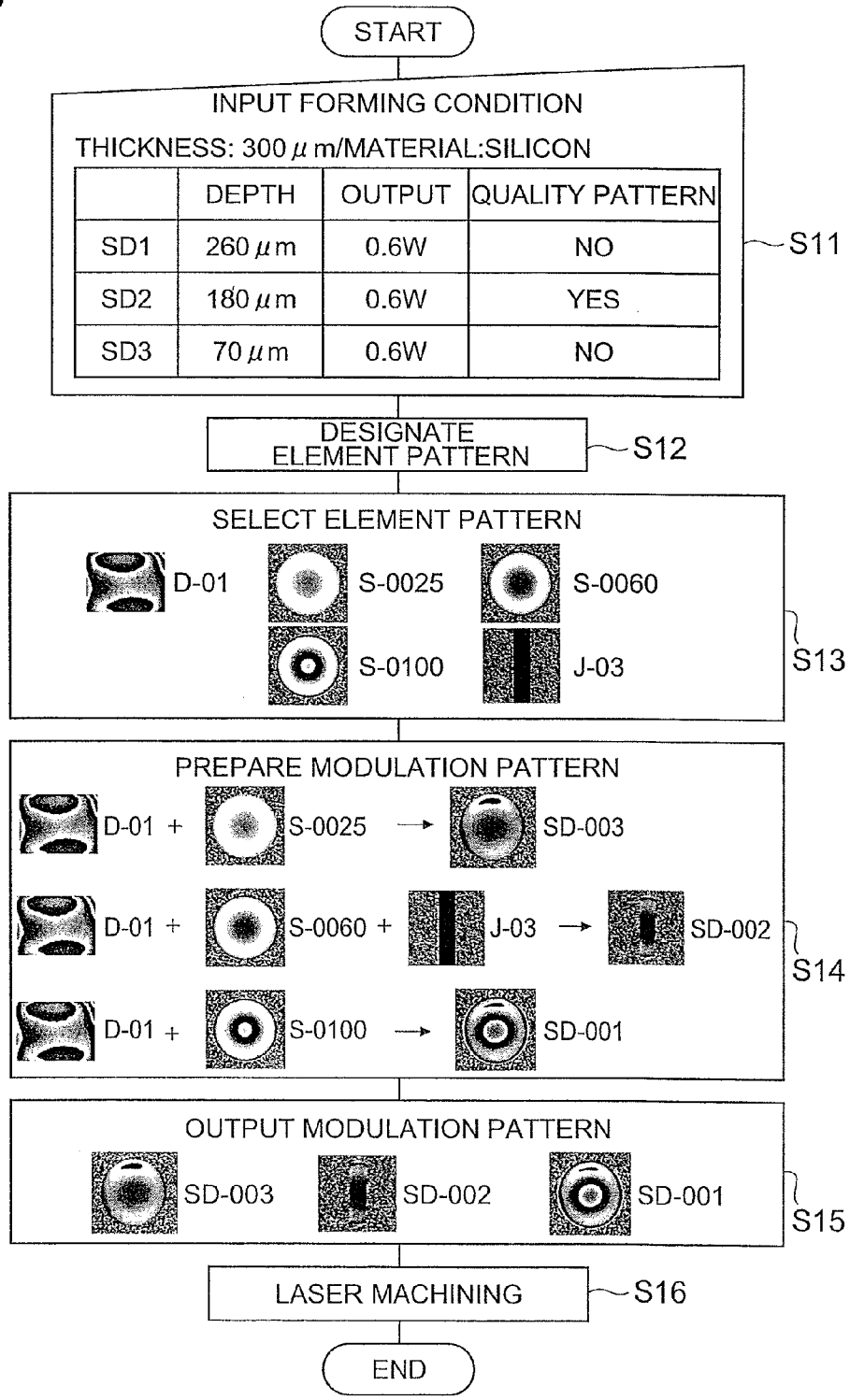
FIG. 26 is a flowchart illustrating an example of a laser machining method performed in the laser machining system of FIG. 24.

An example of laser machining methods performed in the above-mentioned laser machining system 400 will now be explained with reference to FIG. 26. First, the user operates the PC 401, so as to input forming conditions of modified regions 7 for the object 1 (step S11). Here, the thickness of the object 1 is set to 300 μm, while silicon is employed as the material for the object 1. Three rows of modified regions SD1, SD2, SD3 are configured as a plurality of rows of modified regions 7 formed such as to align in the thickness direction of the object 1 for one line 5. For forming the modified region SD1, the distance (depth) from the laser light entrance surface of the object 1 to the converging point P of the laser light L and the output of the laser light L are set to 260 μm and 0.6 W, respectively. For forming the modified region SD2, the distance and output are set to 180 μm and 0.6 W, respectively. For forming the modified region SD3, the distance and output are set to 70 μm and 0.6 W, respectively. Here, the quality pattern is set to "yes" for forming the modified region SD2.

Here, the modified region SD1 corresponds to the modified region 7b for generating the fractures 17b from the modified region to the rear face 21 of the object 1 at the time of forming the modified region, while the modified region SD3 corresponds to the modified region 7a for generating the fractures 17a from the modified region to the front face 3 of the object 1 at the time of forming the modified region. Therefore, this specific example of the second embodiment differs from the above-mentioned second embodiment in that the modified region SD2 is formed in the unmodified region 2 interposed between the modified regions SD1 and SD3.

Subsequently, when the forming conditions of modified regions 7 for the object 1 are fed into the controller 403, the latter selects one or a plurality of kinds of element patterns for each of the modified regions SD1, SD2, SD3 according to the forming conditions and designates the element patterns in association with the modified regions SD1, SD2, SD3 for the PC 402 (step S12). This allows the PC 402 to acquire appropriate element patterns easily and reliably.

Next, when the element patterns are designated for each of the modified regions SD1, SD2, SD3, the PC 402 selects the element patterns from the storage unit 402a in association with each of the modified regions SD1, SD2, SD3 (step S13). Here, the individual difference correction pattern D-01 and spherical aberration correction pattern S-0025 are selected as element patterns in association with the modified region SD3. The individual difference correction pattern D-01, spherical aberration correction pattern S-0060, and quality pattern J-03 are selected as element patterns in association with the modified region SD2. The individual difference correction pattern D-01 and spherical aberration correction pattern S-0100 are selected as element patterns in association with the modified region SD1.

Subsequently, the PC 402 combines a plurality of kinds of element patterns associated with each of the modified regions SD1, SD2, SD3 in order to form the modified regions SD1, SD2, SD3 and employs the combined pattern as a modulation pattern (step S14). Here, the individual difference correction pattern D-01 and spherical aberration correction pattern S-0025 are combined together, so as to prepare a modulation pattern SD-003 for forming the modified region SD3. The individual difference correction pattern D-01, spherical aberration correction pattern S-0060, and quality pattern J-03 are combined together, so as to prepare a modulation pattern SD-002 for forming the modified region SD2. The individual difference correction pattern D-01 and spherical aberration correction pattern S-0100 are combined together, so as to prepare a modulation pattern SD-001 for forming the modified region SD1.

Next, the PC 402 outputs thus prepared modulation patterns SD-001, SD-002, SD-003 in association with the respective modified regions SD1, SD2, SD3 to the laser machining device 300 (step S15). When fed with the modulation patterns SD-001, SD-002, SD-003 in association with the respective modified regions SD1, SD2, SD3, the laser machining device 300 performs laser machining (step S16).

More specifically, in the laser machining device 300, when forming the modified region SD1, the modulation pattern SD-001 is displayed in the liquid crystal layer 216 of the reflective spatial light modulator 203 through the controller 250, whereby the laser light L is modulated by the modulation pattern SD-001. Subsequently, when forming the modified region SD2, the modulation pattern SD-002 is displayed in the liquid crystal layer 216 of the reflective spatial light modulator 203 through the controller 250, whereby the laser light L is modulated by the modulation pattern SD-002. Next, when forming the modified region SD3, the modulation pattern SD-003 is displayed in the liquid crystal layer 216 of the reflective spatial light modulator 203 through the controller 250, whereby the laser light L is modulated by the modulation pattern SD-003.

Thus, when forming the modified regions SD1, SD2, SD3, each modulation pattern includes an individual difference correction pattern and a spherical aberration correction pattern, whereby fluctuations in forming conditions of modified regions caused by individual differences occurring in the laser machining device 300 and the spherical aberration generated at the converging point P of the laser light L can be suppressed. Here, it is desirable that the modified region SD1 located far from the laser light entrance surface of the object 1, the modified region SD2 at an intermediate position, and the modified region SD3 located near the laser light entrance surface of the object 1 be formed sequentially in this order.

In the case of forming the modified regions SD1, SD2, and SD3 in this order, the modulation pattern includes a quality pattern in addition to the individual difference correction pattern and spherical aberration correction pattern when forming the modified region SD2 at the intermediate position. Thus modulating the laser light L by using the quality pattern so as to form the modified region SD2 at the intermediate position can prevent fractures from continuously advancing in the thickness direction of the object 1 at the time of forming the modified regions SD1, SD2 in a row in the thickness direction of the object 1. Then, when a stress is generated in the object 1, fractures generated from the modified regions acting as a start point are easier to extend in the thickness direction of the object 1 than in the case where the modified region SD2 is not formed at the intermediate position, whereby the object 1 can be cut accurately along the lines 5. The modified region SD3 located near the laser light entrance surface of the object 1, the modified region SD2 at an intermediate position, and the modified region SD1 located far from the laser light entrance surface of the object 1 may also be formed sequentially in this order.

Figure 27:
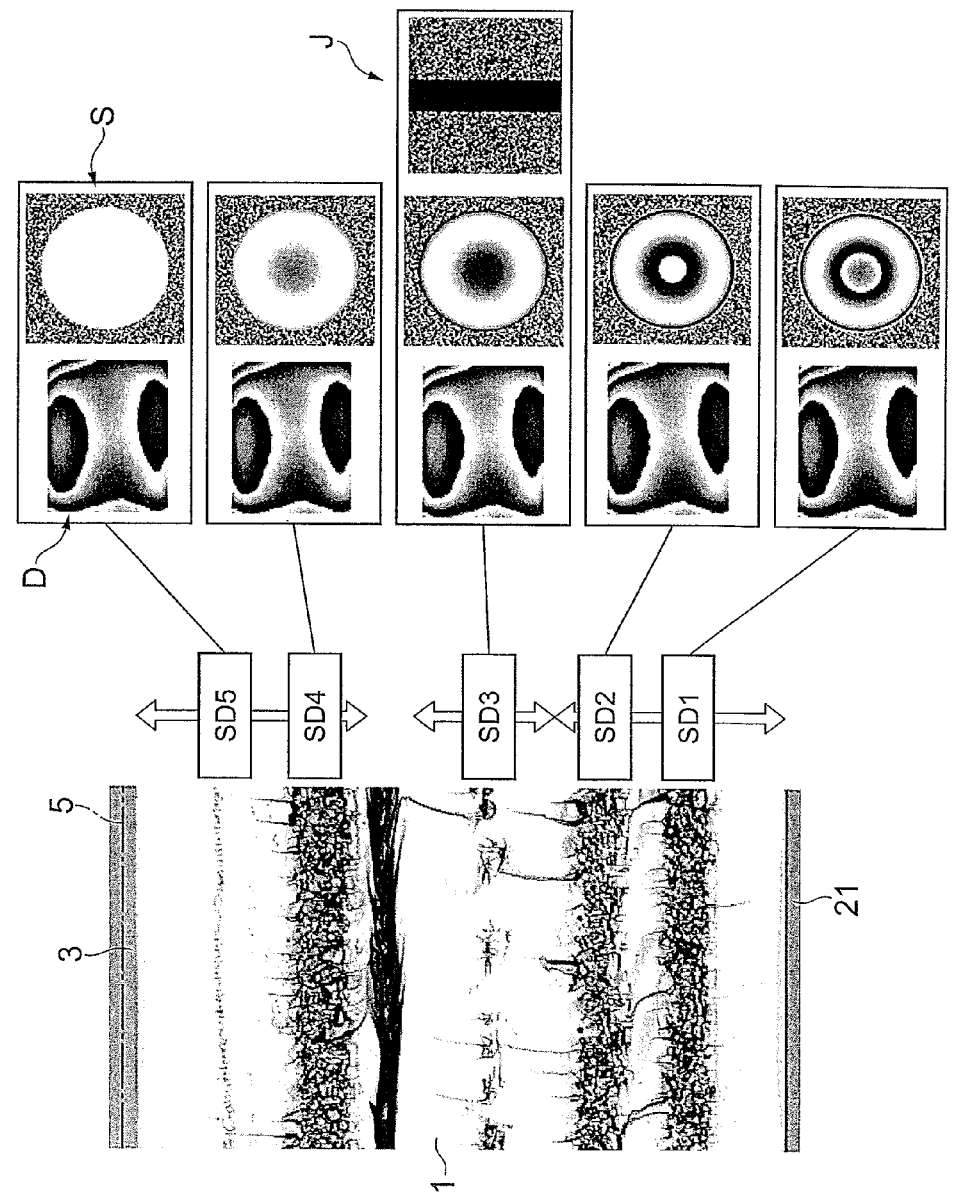
FIG. 27 is a first chart illustrating a cut surface obtained when an object to be processed is cut from modified regions acting as a start point.

The modulation patterns (individual difference correction patterns, spherical aberration correction patterns, and quality patterns) will now be explained. FIG. 27 is a first chart illustrating a cut surface obtained when an object to be processed is cut from modified regions acting as a start point. Here, modified regions SD1 to SD5 were formed in descending order of distance from the front face 3 in the object 1 made of silicon having a thickness of 400 μm while using its front face 3 as a laser light entrance surface. When forming each of the modified regions SD1, SD2 located on the rear face 21 side and the modified regions SD4, SD5 located on the front face 3 side, the laser light L was modulated by a modulation pattern including a spherical aberration correction pattern S which could correct the spherical aberration at its corresponding converging point P of the laser light L in addition to an individual difference correction pattern D. When forming the modified region SD3 at an intermediate position between the positions on the rear face 21 side and front face 3 side, the laser light L was modulated by a modulation pattern including a quality pattern J in addition to the individual difference correction pattern D and spherical aberration correction pattern S.

Here, the modified regions SD1, SD2 correspond to the modified regions 7b for generating the fractures 17b from the modified regions to the rear face 21 of the object 1 at the time of forming the modified regions, while the modified regions SD4, SD5 correspond to the modified regions 7a for generating the fractures 17a from the modified regions to the front face 3 of the object 1 at the time of forming the modified regions. Therefore, this specific example of the second embodiment differs from the above-mentioned second embodiment in that the modified region SD3 is formed in the unmodified region 2 interposed between the modified regions SD1, SD2 and the modified regions SD4, SD5.

As a result, the fractures generated at the time of forming the modified regions SD1, SD2 reached the rear face 21 of the object 1 but failed to connect with the fractures generated at the time of forming the modified region SD3. The fractures generated at the time of forming the modified regions SD4, SD5 reached the front face 3 of the object 1 but failed to connect with the fractures generated at the time of forming the modified region SD3. This made it possible to reduce the number of rows of modified regions 7 formed in the thickness direction of the object 1 along the lines 5 while preventing the accuracy in cutting the object 1 from deteriorating.

Figure 28:
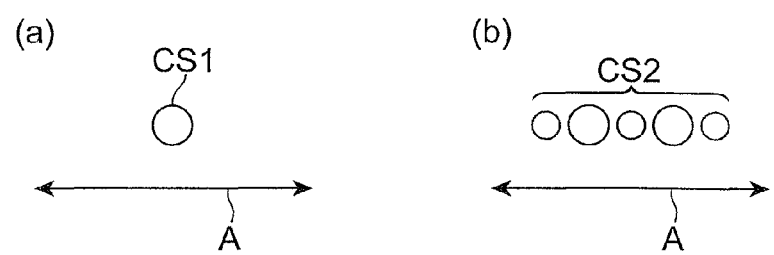
FIG. 28 is a schematic view of converging spots of a laser light for forming a modified region.

FIG. 28 is a schematic view of converging spots of a laser light for forming a modified region. When the laser light L was modulated by a modulation pattern including an individual difference correction pattern and a spherical aberration correction pattern, a converging spot CS1 of the laser light L became a circular region as illustrated in FIG. 28(a). When the laser light L was modulated by a modulation pattern including a quality pattern in addition to the individual difference correction pattern and spherical aberration correction pattern, on the other hand, a converging spot CS2 of the laser light L was formed like a plurality of dot-like regions arranged in a row along the extending direction A of the line 5 (i.e., the direction of relative movement of the laser light L) as illustrated in FIG. 28(b). There were cases where the adjacent dot-like regions partly overlapped each other and where they were separated from each other with a gap.

This seems to be because the laser light L is diffracted in the reflective spatial light modulator 203 by the quality pattern having the first lightness region R1 extending in a direction substantially orthogonal to the line 5 and the second lightness regions R2 located on both sides of the first lightness region R1 in the extending direction of the line 5. Upon irradiation with the laser light L having such a converging spot CS2, modified regions 7 which can prevent fractures from continuously advancing in the thickness direction of the object 1 when forming a plurality of rows of modified regions 7 in the thickness direction of the object 1 can be formed in the object 1.

As explained in the foregoing, the method of cutting an object to be processed performed by utilizing the laser machining system 400 uses the quality pattern having the first lightness region R1 extending in a direction substantially orthogonal to the line 5 and the second lightness regions R2 located on both sides of the first lightness region R1 in the extending direction of the line 5 for modulating the laser light L for forming the modified region 7 at an intermediate position between the positions on the rear face 21 side and front face 3 side in the object 1. That is, the modified region 7 is formed at the intermediate position by irradiation with the laser light L modulated by the reflective spatial light modulator 203 according to the modulation pattern including the quality pattern after forming the modified region 7 at the position on the rear face 21 side before forming the modified region 7 at the position on the front face 3 side while using the front face 3 as the laser light entrance surface (or after fanning the modified region 7 at the position on the front face 3 side before forming the modified region 7 at the position on the rear face 21 side while using the rear face 21 as the laser light entrance surface). Thus forming the modified region 7 at the intermediate position can prevent fractures from continuously advancing in the thickness direction of the object 1 even when the laser light L having a wavelength of 1064 nm or more is used so as to reduce the number of rows of modified regions 7 in the case where a plurality of rows of modified regions 7 are formed in the thickness direction of the object 1. Also, when a stress is generated in the object 1, fractures generated from the modified regions 7 acting as a start point are easier to extend in the thickness direction of the object 1 than in the case where the modified region 7 is not formed at the intermediate position, whereby the object 1 can be cut accurately along the line 5. Hence, this method of cutting an object to be processed can reduce the number of rows of modified regions 7 formed in the thickness direction of the object 1 along the line 5 while preventing the accuracy in cutting the object 1 from deteriorating, so as to shorten the takt time.

Here, in the quality pattern, it is preferred that, in the extending direction of the line 5, the width of the first lightness region R1 be 20% to 50% of the width of the effective region R for modulating the laser light L in the modulation pattern. In this case, the modified region 7 that can reliably prevent fractures from continuously advancing in the thickness direction of the object 1 when forming a plurality of rows of modified regions 7 in the thickness direction of the object 1 can be formed at the intermediate position. In the extending direction of the line 5, the width of the first lightness region R1 may be either narrower or wider than the width of each of the second lightness regions R2.

Preferably, the laser light L is modulated by the reflective spatial light modulator 203 according to the modulation pattern including the quality pattern, individual difference correction pattern, and spherical aberration correction pattern when forming the modified region 7 at the intermediate position, and the modulation pattern including the individual difference correction pattern and spherical aberration correction pattern when forming the modified regions 7 at the positions on the rear face 21 side and the front face 3 side. In this case, the modified regions 7 formed at the intermediate position and the positions on the rear face 21 side and front face 3 side are easier to generate fractures, whereby the number of rows of modified regions 7 formed in the thickness direction of the object 1 along the line 5 can be reduced more reliably.

Preferably, the laser light L has a wavelength of 1080 nm or more. This raises the transmittance for the laser light L in the object 1, so that the modified regions 7 formed at the intermediate position and the positions on the rear face 21 side and front face 3 side are easier to generate fractures, whereby the number of rows of modified regions 7 formed in the thickness direction of the object 1 along the line 5 can be reduced more reliably.

Cutting the object 1 along the line 5 from the above-mentioned modified regions 7 acting as a start point can accurately cut the object 1 along the line 5. A highly reliable semiconductor device can be obtained when manufactured by cutting the object 1.

Though the second embodiment of the present invention has been explained in the foregoing, the present invention is not limited thereto.

For example, as illustrated in FIG. 29, the number of rows of modified regions 7 (corresponding to the modified regions 7b in the first embodiment) formed at positions on the rear face 21 side, the number of rows of modified regions 7 (corresponding to the modified regions 7a in the first embodiment) formed at positions on the front face 3 side, and the number of rows of modified regions 7 (corresponding to modified regions formed in the unmodified region 2 in the second embodiment) formed at intermediate positions may be changed according to the thickness and material of the object 1. The number of rows of modified regions 7 formed at positions on the rear face 21 side can be determined such that fractures can be generated from the modified regions 7 to the rear face 21, while the number of rows of modified regions 7 formed at positions on the front face 3 side can be determined such that fractures can be generated from the modified regions 7 to the front face 3. The number of rows of modified regions 7 formed at the intermediate positions can be determined such that fractures can be prevented from continuously advancing in the thickness direction of the object 1 when forming a plurality of rows of modified regions 7 in the thickness direction of the object 1.

In addition to the quality pattern, individual difference correction pattern, and spherical aberration correction pattern, an astigmatism correction pattern for correcting the astigmatism at the converging point P of the laser light L and the like may be used as an element pattern to become an element of a modulation pattern.

The spatial light modulator is not limited to the LCOS-SLM, but may be MEMS (MicroElectroMechanical System)-SLM, DMD (deformable mirror device), or the like. The spatial light modulator is not limited to the reflective type, but may be of transmissive type. Examples of the spatial light modulator include those of liquid crystal cell type and LCD type. The reflective spatial light modulator 203 may utilize the reflection of pixel electrodes of the silicon substrate in place of the dielectric multilayer mirror.

INDUSTRIAL APPLICABILITY

A sheet-like object to be processed equipped with a silicon substrate can be cut accurately along a line to cut the object, while the number of rows of modified regions formed in the thickness direction of the silicon substrate along the line can be reduced.

REFERENCE SIGNS LIST

1 . . . object to be processed; 5 . . . line to cut the object; 7 . . . modified region; 12 . . . silicon substrate; 12a . . . front face; 12b . . . rear face; 12c . . . cut surface; L . . . laser light; P . . . converging point

The invention claimed is:

1. A method of cutting an object to be processed, the method of irradiating a sheet-like object to be processed equipped with a silicon substrate with a laser light so as to form a modified region in the silicon substrate along a line to cut the object and cutting the object along the line from the modified region acting as a cutting start point, the method comprising the steps of:

forming a first modified region as the modified region so as to generate a first fracture from the first modified region to one main face of the object along the line, and a second modified region as the modified region on the other main face side of the first modified region such that an unmodified region is interposed between the first and second modified regions so as to generate a second fracture from the second modified region to the other main face along the line without connecting the second fracture to the first fracture in the unmodified region; and generating a stress in the object so as to connect the first and second fractures to each other and cut the object along the line, wherein the first and second modified regions are formed such that, in a pair of cut surfaces of the object cut along the line, the unmodified region in one cut surface is formed with a projection extending in a direction intersecting the thickness direction of the silicon substrate, while the unmodified region in the other cut surface is formed with a depression corresponding to the projection; and wherein the projection has a height of 2 μm to 6 μm and a width of 6 μm to 17 μm in the thickness direction of the silicon substrate.

2. A method of cutting an object to be processed according to claim 1, wherein the first and second modified regions are formed such that, assuming the main faces of the silicon substrate to be (100) planes, the cut surfaces are (110) planes, and the surfaces forming the projection and depression are (111) planes.

3. A method of cutting an object to be processed according to claim 1, wherein a plurality of rows of first modified regions are formed in the thickness direction of the silicon substrate along the line.

4. A method of cutting an object to be processed according to claim 1, wherein a plurality of rows of second modified regions are formed in the thickness direction of the silicon substrate along the line.

5. A method of cutting an object to be processed according to claim 1, wherein the modified region includes a molten processed region, the molten processed region being a region having changed from a monocrystal structure to an amorphous structure, a region having changed from the monocrystal structure to a polycrystal structure, or a region having changed from the monocrystal structure to a structure including the amorphous and polycrystal structures; and wherein the unmodified region is a region having the monocrystal structure.

6. A method of cutting an object to be processed according to claim 1, wherein the laser light has a wavelength of 1080 nm or more.

7. A method of cutting an object to be processed according to claim 1, wherein the first and second modified regions are formed such that the width of the unmodified region in the thickness direction of the silicon substrate is 10% to 30% of the thickness of the silicon substrate.

8. A method of cutting an object to be processed according to claim 1, wherein, when forming a third modified region as a modified region in the unmodified region interposed between the first and second modified regions after forming the first modified region before forming the second modified region, the laser light is modulated by a spatial light modulator according to a modulation pattern including a quality pattern having a first lightness region extending in a direction intersecting the line and second lightness regions neighboring the first lightness region on both sides in an extending direction of the line.

9. A method of cutting an object to be processed according to claim 8, wherein a converging spot of the laser light when forming the third modified region has a form comprising a plurality of dot-like regions arranged in a row in the extending direction of the line.

10. A method of cutting an object to be processed according to claim 1, wherein the object is cut so as to produce a semiconductor device.

* * * * *